United States Patent [19]

Heckman et al.

[11] Patent Number: 5,019,829
[45] Date of Patent: May 28, 1991

[54] PLUG-IN PACKAGE FOR MICROWAVE INTEGRATED CIRCUIT HAVING COVER-MOUNTED ANTENNA

[76] Inventors: Douglas E. Heckman, 436 Oakridge Dr., Indialantic, Fla. 32903; Dawn A. Larson, 8197 Hearthstone Ct., Cincinnati, Ohio 45241; Jeffrey A. Frisco, 880 Arabia Road S.E., Palm Bay, Fla. 32907; David A. Haskins, 7349 Ohio Avenue, Hammond, Ind. 46323

[21] Appl. No.: 307,503

[22] Filed: Feb. 8, 1989

[51] Int. Cl.[5] .................. H01Q 13/08; H01Q 1/28; H03H 7/38; H05K 5/06
[52] U.S. Cl. ................... 343/700 MS; 343/705; 343/776; 343/853; 343/909; 333/33; 333/247; 174/52.3; 174/52.5; 357/74; 361/392; 361/394
[58] Field of Search ................ 333/32, 33, 247; 343/700 R, 700 MS, 701, 705, 708, 753, 776, 777, 853, 909; 174/52.3, 52.5; 361/392–394, 382; 342/368, 311–313; 357/74, 80

[56] References Cited

U.S. PATENT DOCUMENTS

| | | | |
|---|---|---|---|
| 3,349,481 | 10/1967 | Karp | 357/80 X |
| 3,549,949 | 12/1970 | Granberry | 361/393 X |
| 3,784,726 | 1/1974 | Smith et al. | 174/52.3 |
| 4,771,294 | 9/1988 | Wasiloosky | 361/392 X |

FOREIGN PATENT DOCUMENTS 2638906 3/1978 Fed. Rep. of Germany ...... 343/700 MS

*Primary Examiner*—Benny T. Lee
*Attorney, Agent, or Firm*—Evenson, Wands, Edwards, Lenahan & McKeown

[57] ABSTRACT

A TO-style plug-in package for MMICs and associated antenna structure is comprised of a microwave circuit component carrier having a generally cylindrically shaped conductive header upon which one or more MMICs are supported. An aperture through the header contains a conductor pin supported within a glass seal interface, so as to form a hermetically sealed matched impedance transmission line through the package. The conductor pin is connected to a bonding pad of a microwave circuit component on the header. A generally cylindrical conductive cover engages the header and encloses a cavity within which the microwave circuit components are supported. A microstrip antenna is supported on a dielectric layer overlying an outer surface of the conductive cover and is connected to a further conductor pin that extends through a glass-sealed aperture in the cover and forms a matched impedance transmission line from the antenna to the header. The interface between the further conductor pin and the header is configured to provide an effectively blind mated, matched impedance feed-through signal path, so as to facilitate attachment of the conductive cover to the header.

60 Claims, 18 Drawing Sheets

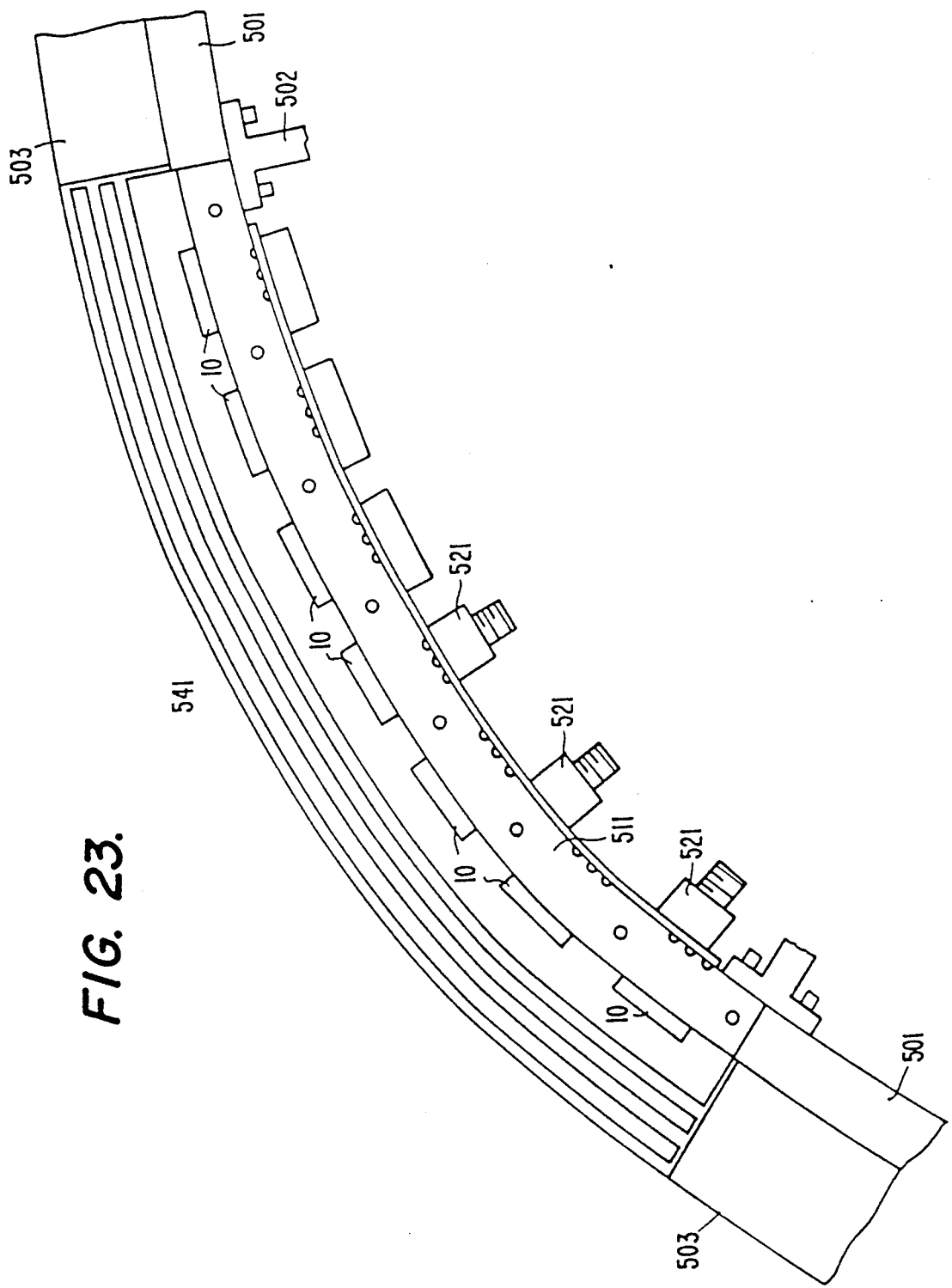

PLUG-IN PACKAGE FOR MICROWAVE INTEGRATED CIRCUIT HAVING COVER-MOUNTED ANTENNA

FIELD OF THE INVENTION

The present invention relates in general to the packaging of electronic circuit components and is particularly directed to a can-type, plug-in package for monolithic microwave integrated circuits having an antenna element incorporated into the cover of the package

BACKGROUND OF THE INVENTION

Through refinements in circuit design and semiconductor processing methodologies it has now become possible to integrate in a monolithic miniaturized packaging scheme substantially all of the components of which an RF communication system may be configured. As the demand for higher operational frequencies and bandwidth utilization has increased, however, the use of the support/housing structure as a signal processing environment and a radiation site has been limited by the size of and the unwanted mutual coupling between the antenna elements and the components of adjacent signal processing networks. As a consequence separate supports are conventionally employed for the antenna elements and the microwave chip carriers that contain the signal processing circuitry, yielding an overall packaging scheme that is large-sized and therefore not necessarily optimized for use with complex communication-/avionics equipment, such as that incorporated in high performance military aircraft. Moreover, for such applications, the unique dimensional tolerances and heat transfer characteristics of the devices have effectively prevented a standardized packaging scheme. Instead microwave device housings have been typically custom-designed thereby constituting a significant portion of production cost.

One proposal to standardize the packaging of such circuits has been to use conventional TO-style, plug-in cans, originally employed for discrete devices and in the early days of integrated circuit development. Unfortunately, however, because the conventional TO-style can is designed for components that operate at frequencies considerably less than the signal processing bandwidth of present day microwave (e.g. GaAs-resident) devices, it has a practical upper operational frequency limit on the order of one to three GHz or less.

In our copending U.S. patent application, Ser. No. 888,934 entitled "Plug-in Package for High Speed Microwave Integrated Circuits", filed July 24, 1986, now U.S. Pat. No. 4,951,011, issued Aug. 21, 1990, and assigned to the assignee of the present application, there is described an improved TO-style, plug-in can configuration designed for present day high frequency (e g 10–40 GHz) microwave signalling applications. Specifically, through an improved pin/glass seal interface, what would otherwise be an impedance mismatch between a monolithic microwave integrated circuit (MMIC) and the external world is effectively 'tuned out', so that the sought after standardization aspects of conventional TO-style cans are retained, thereby facilitating the interfacing of the packaged circuit components with a variety of signal transmission networks.

SUMMARY OF THE INVENTION

In accordance with the present invention there is provided a further enhancement of the 'tuned' TO-style plug-in can described in the above referenced copending application, through which standardized packaging of both MMICs and their associated antenna elements in the same modular configuration is achieved. Pursuant to a first embodiment of the present invention, the improved TO-style plug-in package is comprised of a microwave circuit component carrier having a generally cylindrically shaped conductive header upon which one or more monolithic microwave integrated circuit components are supported. The header preferably has a tiered or stepped interior support surface upon which microwave circuit components of different thicknesses may be supported in an essentially coplanar arrangement and at least one aperture that is coaxial with the axis of the cylindrical shape of the header. The aperture contains a conductor pin supported within a glass seal interface, so as to form a hermetically sealed matched impedance transmission line between the interior and exterior portions of the package. The conductor pin is connected to a bonding pad of a microwave circuit component on the header.

A generally cylindrical or cup shaped conductive cover engages the header and encloses a cavity within which the microwave circuit components are supported. A microstrip antenna element (which may be a patch antenna or the launch point for a waveguide antenna mounted to the cover) is supported on a dielectric layer overlying an outer surface of the conductive cover and is connected to a further conductor pin that extends through a glass-sealed aperture in the cover and forms a matched impedance transmission line from the antenna to the header. The interface between the further conductor pin and the header is configured to provide an effectively blind mating impedance feedthrough signal path, so as to facilitate attachment of the conductive cover to the header. For this purpose the interface may employ an electro-mechanical contact, such as a spring tab or solder connection, or it may be contactless, employing capacitive coupling between mutually aligned, spaced-apart portions of a microstrip filter arranged on an interior surface portion of the cover and on the support surface of the header.

To provide electromagnetic shielding of circuit components within the cavity a shaped wall spring member having an arrangement of foldable tabs may be retained between the interior surface of the cover and the header. The folded tabs of the spring member form a pattern of conductive walls that are contiguous with the conductive cover and the header, thereby effectively surrounding circuit components within the cavity with a continuous ground plane. Retention of the shaped wall spring member between the cover and the header may be facilitated by contouring the interior surface of the cover, so that the folded spring member 'fits' within or is captured between the contoured interior surface of the cover and the header.

In accordance with a further embodiment of the invention the interior surface of the cover may be used to support one or more additional microwave integrated circuit components, thereby providing a three dimensional packaging of the circuits. For this purpose, a support substrate may be mounted to the interior surface of the cover with the chip(s) mounted to the surface of the support substrate. This configuration permits relatively low power consumption components, such as processor and memory chips to be spaced apart from the header, which forms the heat removal mechanism for the package.

Because of its compact size and total system integration capacity the improved TO-style, plug-in can packaging scheme of the present invention makes it useful in advanced technology applications, such as dynamic signalling platforms. One particularly practical application of the invention is its incorporation into the surface structure of a high performance airframe, so as to form a 'smart-skin' for the aircraft with both signal processing and radiation components being housed in what is effectively a thin micro structure that may be integrated within and/or conformally mounted to a confined surface area support framework.

BRIEF DESCRIPTION OF THE DRAWINGS

FIG. 23 illustrates the manner in which the cover mounted antenna TO-style package of the present invention may be configured to effectively form a "smart-skin" for an aircraft.

DETAILED DESCRIPTION

Figure 1:
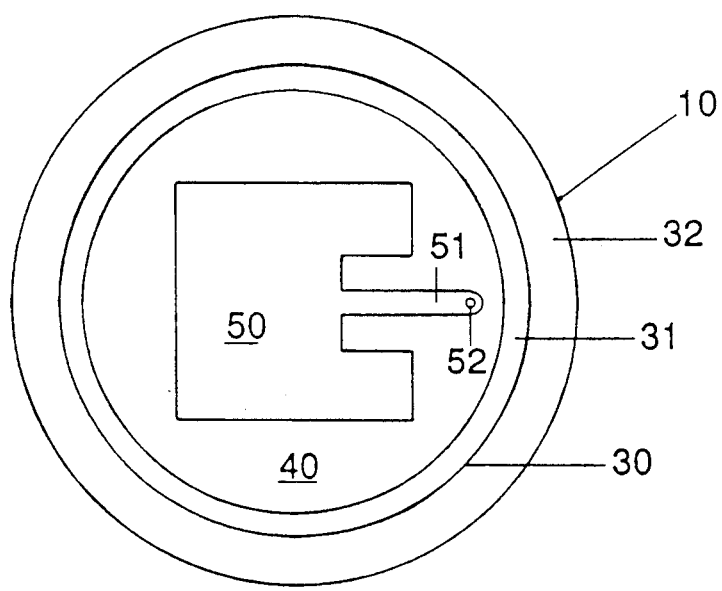
FIGS. 1 and 2 respective diagrammatic external top and side views of the TO-type plug-in package for a monolithic microwave integrated circuit and associated antenna element.
Figure 2:
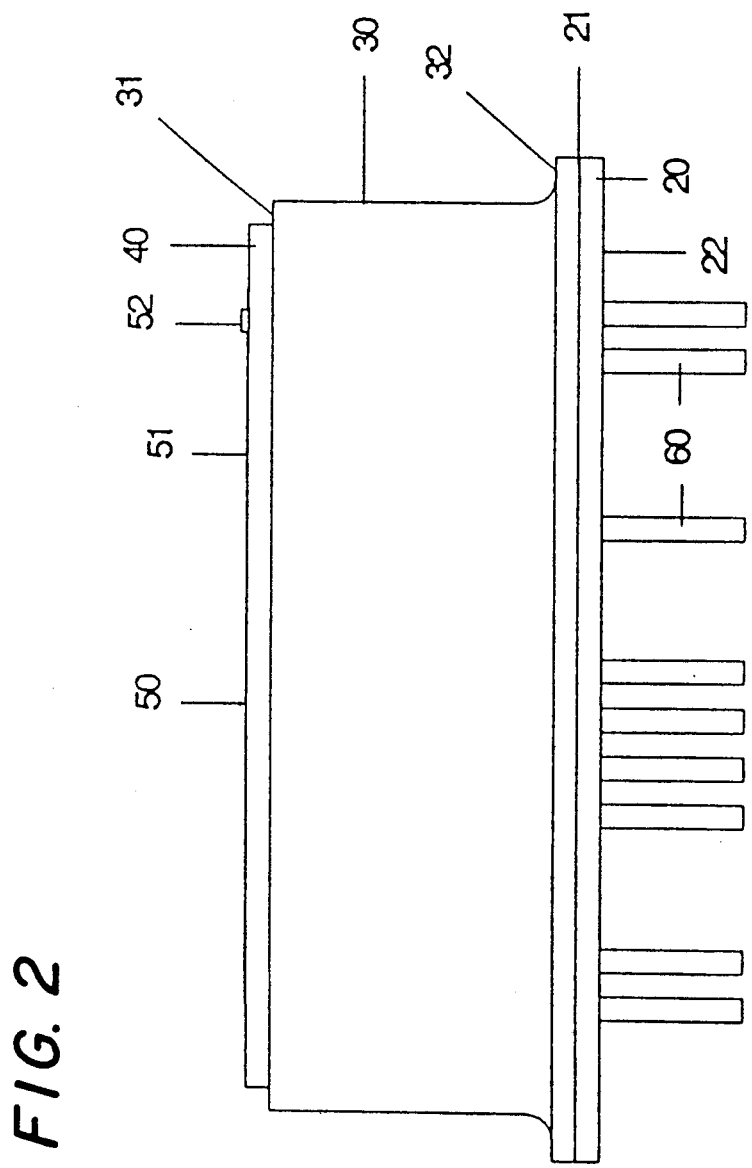

Referring now to FIGS. 1 and 2, there are illustrated respective top and side external views of an improved TO-typed plug-in package 10 for a monolithic microwave integrated circuit and associated antenna element in accordance with the present invention. Package 10 includes a generally circularly shaped header 20 which supports one or more monolithic microwave integrated circuit components thereon (not shown in FIGS. 1 and 2) and has attached at an annular portion 21 thereof a protective cylinder or cup-shaped conductive cover 30 having a flange 32 sealingly engaging annular surface portion 21 of the header 20. A substantially circular or disk. shaped dielectric layer 40 is formed on the top surface 31 of the cover 30 and provides an insulative support base for an overlying layer of conductive material which forms an antenna element 50. As shown in FIG. 1, antenna 50 element is a substantially square-shaped patch element having a tab or finger portion 51 extending to a lead attachment point 52 through which the antenna is connected to the integrated circuit components that are supported within the interior of the package, as will be described below. For a frequency range of 9.7-10.0 GHz, package 10 may have a diameter on the order of 0.6 inches. Patch antenna element 50 may have an edge dimension in a range of 0.2-0.5 inches.

Also shown in FIG. 2 are a plurality of conductive pins 60 which extend through apertures in the header 20 and project beyond its bottom surface 22. Header 20 is typically made of Kovar or other suitable metal or alloy and forms, together with conductive cover 30, a ground plane for the package.

Figure 3:
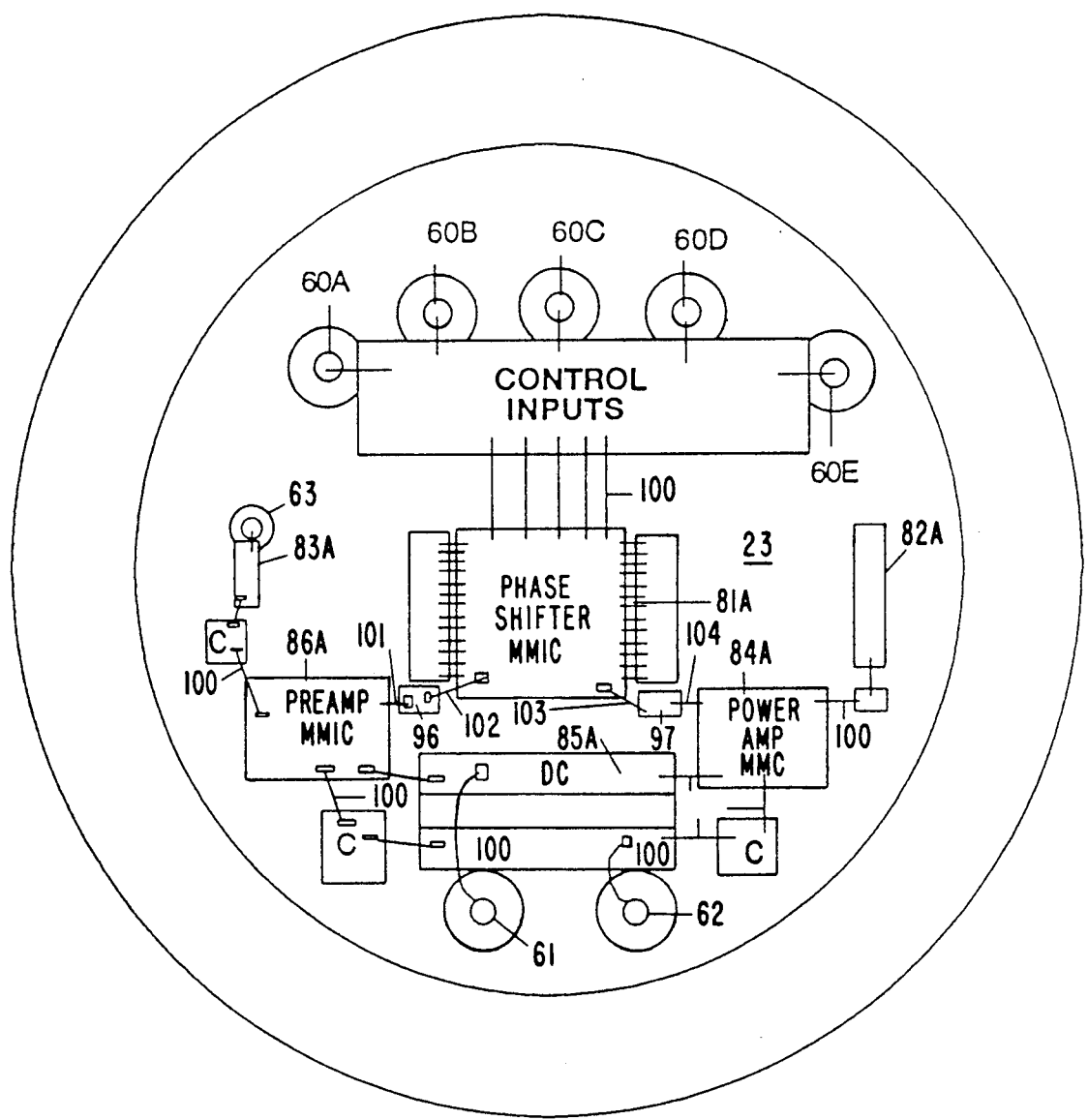
FIG. 3 and 4 are diagrammatic plan and side views of the package shown in FIGS. 1 and 2, illustrating the internal configuration of the components of the package.
Figure 4:
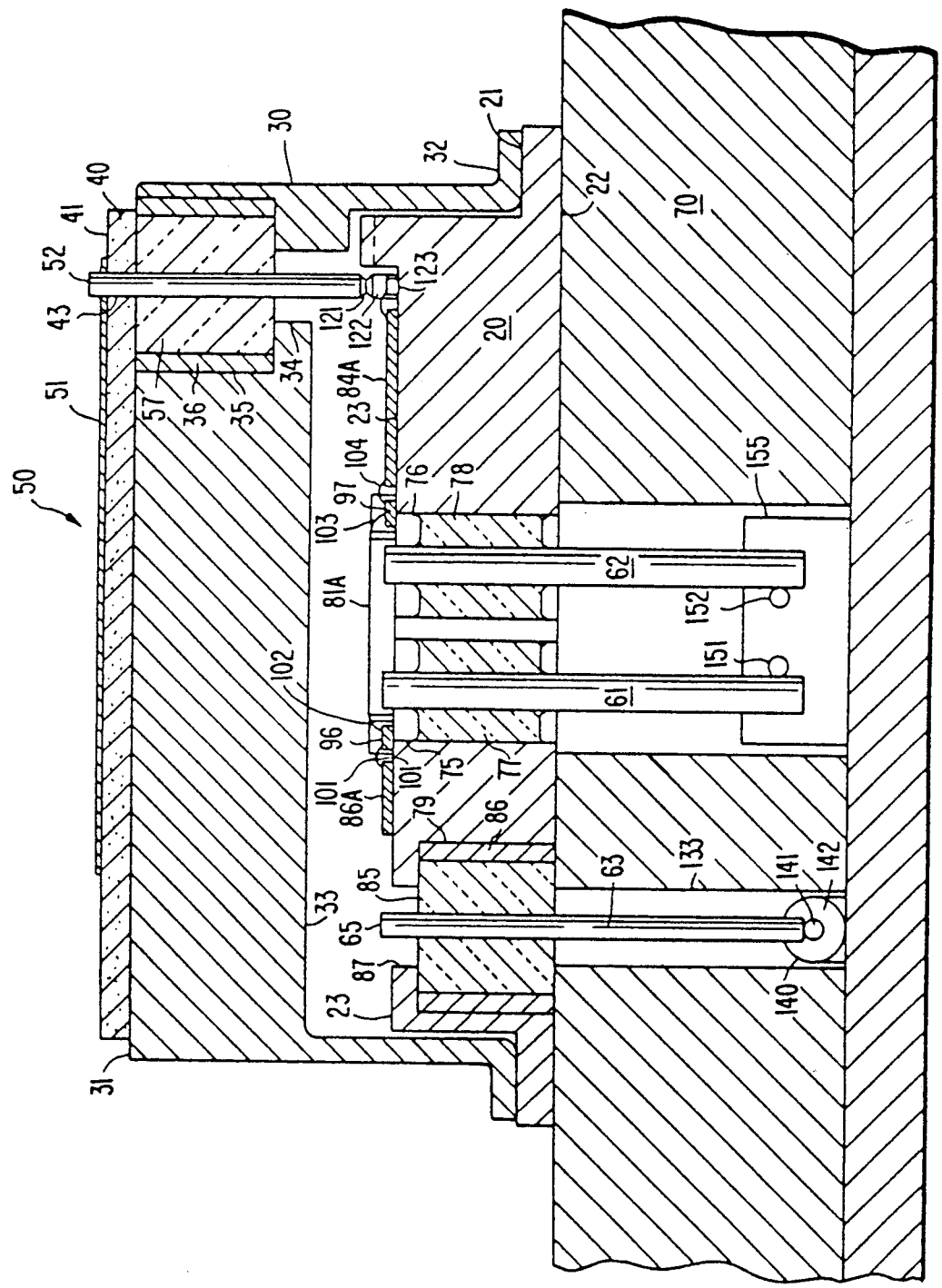

FIGS. 3 and 4 are diagrammatic plan and side views of package 10 shown in FIGS. 1 and 2 but illustrating the internal configuration of the components of the package. In addition, FIG. 4 shows the mounting of the bottom surface 22 of the header 20 to a support/transmission line structure 70, such as a conductive plate having a set of transmission channels formed therethrough to which the connection pins 60 of the package are coupled and which provides an effective thermal heat sink for the package.

In the plan view of FIG. 3, there is illustrated a set of monolithic microwave chip components 81A-86A, 96 and 97 distributed on the top surface 23 of the header 20. FIG. 4 also shows components 86A, 96, 81A, 97 and 84A and bridging wires 101-104. The types of circuits and the functions formed thereby do not form a part of the invention and a description thereof will not be presented here. Typically however, such components may include power amplifiers, power supply connection ports, low noise amplifier components, phase shift networks, microprocessor and memory chips, etc resident in high speed semiconductor material, such as gallium arsenide. Bonding leads on the respective integrated circuit components are coupled through bonding wires, shown generally at 100 to bonding pads on other chips and to conductor pins 60A-60E for providing signal connections to the external world and to conductor pins, such as pin 52, which are connected to the antenna element overlying the outer surface of the cover.

As shown in FIG. 4, package cover 30 is of substantial thickness (e g. 0.050 inches) to provide a relatively thick ground plane and to facilitate control of the impedance of the conductive path through the pin 52 from the antenna element 50 on top surface 41 of dielectric layer 40 overlying the cover 30 and a connection point. shown at region 121. to microwave integrated circuit components disposed on the top surface 23 of the header 20. As shown in FIG. 4. the top surface 23 of header 20 is generally parallel to the top surface 41 of dielectric layer 40 overlying cover 30, so that antenna element 50 is parallel to a microwave circuit component mounted on header 20, thereby compacting the size of the package and facilitating application to the above-referenced microstrip structure. Because antenna element 50 is parallel to the microwave circuit component, its radiation wave launch direction is orthogonal to the planar mounting surface of header 20. Further illustrated in the upper right-hand portion of FIG. 4, cover 30 has a stepped cylindrical aperture formed of a relatively narrow cylindrical aperture portion 34 and a relatively wide cylindrical aperture portion 35. Aperture 34 extends from the interior surface 33 of the cover and aperture 35 extends from the top surface 31 of the cover to be contiguous with aperture 34, each aperture being coaxial with the other. The sidewall of aperture 35 is coated with a layer of conductive material such as gold, copper, molybdenum or fit with a conductive ferrule or sleeve 36 and the annular region between pin 52 and conductive sleeve 36 is filled with glass 57, such as Corning Quartz Glass No. 7070 so as to provide a hermetic seal between pin 52 and cover 30 and effectively establish a prescribed characteristic impedance through the pin connection (e.g 50Ω). Suitable dimensions for the diameter of pin 52, its length and the diameters of the apertures and glass are 0.012 inches 0.050 inches and 0.050 inches, respectively, so as to provide a 50Ω impedance feed through from conductive layer 51 through aperture 43 in dielectric layer 40 to the integrated circuit components on the top surface 23 of header 20. In this regard, it is to be observed that the reduced diameter aperture portion 34 contains no glass dielectric. By properly proportioning the length of the relatively wide aperture portion 35 and the relatively narrow aperture portion 34, as well as the dielectric material contained in the apertures, it is possible to tailor the impedance of the transmission path through pin 52 from the antenna to the integrated circuit components in a range from 15 to 75 Ohms. The bottom 121 of pin 52 is electrically connected with a conductor 122 at region 123 of header 20.

The header 20 itself may be configured in the manner described in the above-referenced copending patent application to facilitate the mounting of the microwave integrated circuit chips and the connection of feedthrough pins 60A-60E. As described in that application, the header, like that of a conventional TO-style plug-in package, is metallic (e.g. Kovar) and provides a ground plane for the transmission line pin/glass interface between one of the integrated circuit components 81A-86A and the external world (signal and power connection links in support plate 70). As described above, header 20 has an interior (top) surface 23 upon which the microwave integrated circuit components are mounted, and an exterior (bottom) surface 22 parallel with surface portion 23. Each pin/glass interface is formed by a center conductor pin, such as pins 61, 62 and 63, extending through respective cylindrical slots or apertures in the header 20. As shown in FIG. 4, pin 61 extends through a cylindrical aperture 75 while pin 62 extends through a cylindrical aperture 76. Pin 63 has a top or end surface 65 and extends through a stepped cylindrical aperture, having a relatively wide diameter portion 79 contiguous with a relatively narrow cylindrical aperture portion 87, the narrow portion 87 of the aperture extending to the surface 23 of the header, while the wider portion 79 extends to the surface 22 of the header.

The pins are retained in their respective apertures by glass seals and which support the pins in spaced apart relationship with surrounding cylindrical sidewalls of the apertures. Again the apertures may be conductively coated or include a metallic ferrule or sleeve of Kovar metal alloy. In particular, pin 61 is surrounded by a glass seal 77 which is contiguous with the cylindrical sidewall of aperture 75 and the outer surface of pin 61. Similarly, pin 62 is surrounded by a glass seal 78 which is contiguous with the outer surface of the pin 62 and the cylindrical sidewall of the aperture 76. Pins 61 and 62 are used for DC power connections and may be joined directly to power wiring shown at 151 and 152 passing through a channel or groove 155 in plate 70.

Pin 63 is employed as a signal line connector passing through a channel 133 in plate 70 to the center conductor 141 of a wire 140 clad at 142 and requires the use of a 50 Ohm impedance match through aperture 79. For this purpose, as described in the above-referenced copending application and as is the case with the coupling of pin 52 through cover 30, the interior face or sidewall of aperture 79 may be conductively (e.g. gold) plated to facilitate conductive bonding of a metallic ferrule 86 to the header. Preferably the material of glass seal 85 is a quartz glass (such as Corning Glass No. 7070 referenced) which has a lower dielectric constant (on the order of 3.9-4.0) than that of a typical Corning 7052 ($\epsilon_r=5$) employed in conventional TO-style plug-in packages. Like pin 52, the outer diameter of pin 63 is preferably on the order 12 mils, which is considerably (33%) less than the 18 mil outer diameter of pins 61 and 62 for use with the power line connections and are indeed employed for signal line connections in conventional TO-style cans.

In addition, the outer diameter of glass seal 85 is on the order of only 40 mils, compared with the 60-80 mil diameter of glass seals in conventional TO-style cans. This decrease in the dimensions of pin 63 and the glass seal 85 facilitates a reduction in center-to-center pin spacing, so as to readily conform with industry standard spacings of 50 mils, 100 mils, etc. By employing a glass having a relatively small dielectric constant, the resulting impedance is on the order of 50 Ohms, as pointed out above. In this regard, it is to be observed that the characteristic impedance of the pin/glass interface is defined in accordance with the expression:

$$Z_O = (k/(\epsilon_r)^{\frac{1}{2}}) \, Ln \, (D_{glass}/D_{pin}),$$

where k is a constant (e.g. 59.9) and $\epsilon_r$ is the dielectric constant of the surrounding medium (glass (e.g. 4.0)), $D_{glass}$ is the outer diameter of the glass (e.g. 66 mils and $D_{pin}$ is the outer diameter of the pin (e.g. 12 mils as noted above).

Because of the reduction in the diameter of the pin 63, (12 mils from 18 mils), the inductance component of the electrical connection between the pins 63 and an integrated circuit component mounted on the surface 23 of header 20 is increased, thereby introducing an unwanted parasitic reactance in the signal coupling path. This parasitic reactance includes the inductance of the bonding wire that connects the pin 63 to a bonding pad on a microwave integrated circuit chip 83A and the inductance of that portion of the pin extending interiorally of the glass seal. To offset this series inductance formed by the bonding wire and the pin, the diameter of the aperture is reduced at region 87 so as to form an air dielectric transmission line between pin 65 and the adjacent encircling ground plane of header 20. This reduction in the diameter of the aperture 87 permits the integrated circuit component to placed closer to the pin, thereby reducing the bonding length. The reduction in bonding length of bonding wires 100 for the signal conductors is shown in plan in FIG. 3 wherein pin 63 is shown as being located substantially immediately adjacent integrated circuit component 83A, whereas power pins 61 and 62 are spaced further apart from DC interface component 85A.

For additional reactance compensation, the header may be machined to have surrounding ridges, as described in the above-referenced copending application, so as to tune out residual inductance and wire bond inductance at that portion of the pin which extends above the surface of the header. A determination of the exact length of the reduced diameter aperture 87 and length of the pin extending therethrough depends upon the intended frequency of operation, wire size, and glass composition. Through changes in the dimensions and materials employed, the effective characteristic impedance may be controlled over a range of 20-100 Ohms throughout a 40 GHz bandwidth.

As will be appreciated from the foregoing description, the present invention employs the improved matched impedance (e.g. 50Ω) sealed glass reduced diameter pin interface employed for header feedthrough connections in the TO-style can described in the copending application referenced above, for coupling a microstrip antenna in the outer surface of the cover through the cover to an interior cavity of the can for connection to a microwave integrated circuit. By increasing the thickness of the cover to basically correspond to that of the header, what is effectively obtained is a pair of headers that define a chip containing cavity, one of the headers being formed by the increased thickness cover and the other header being the normal header employed for mounting the integrated circuit components.

Figure 5:
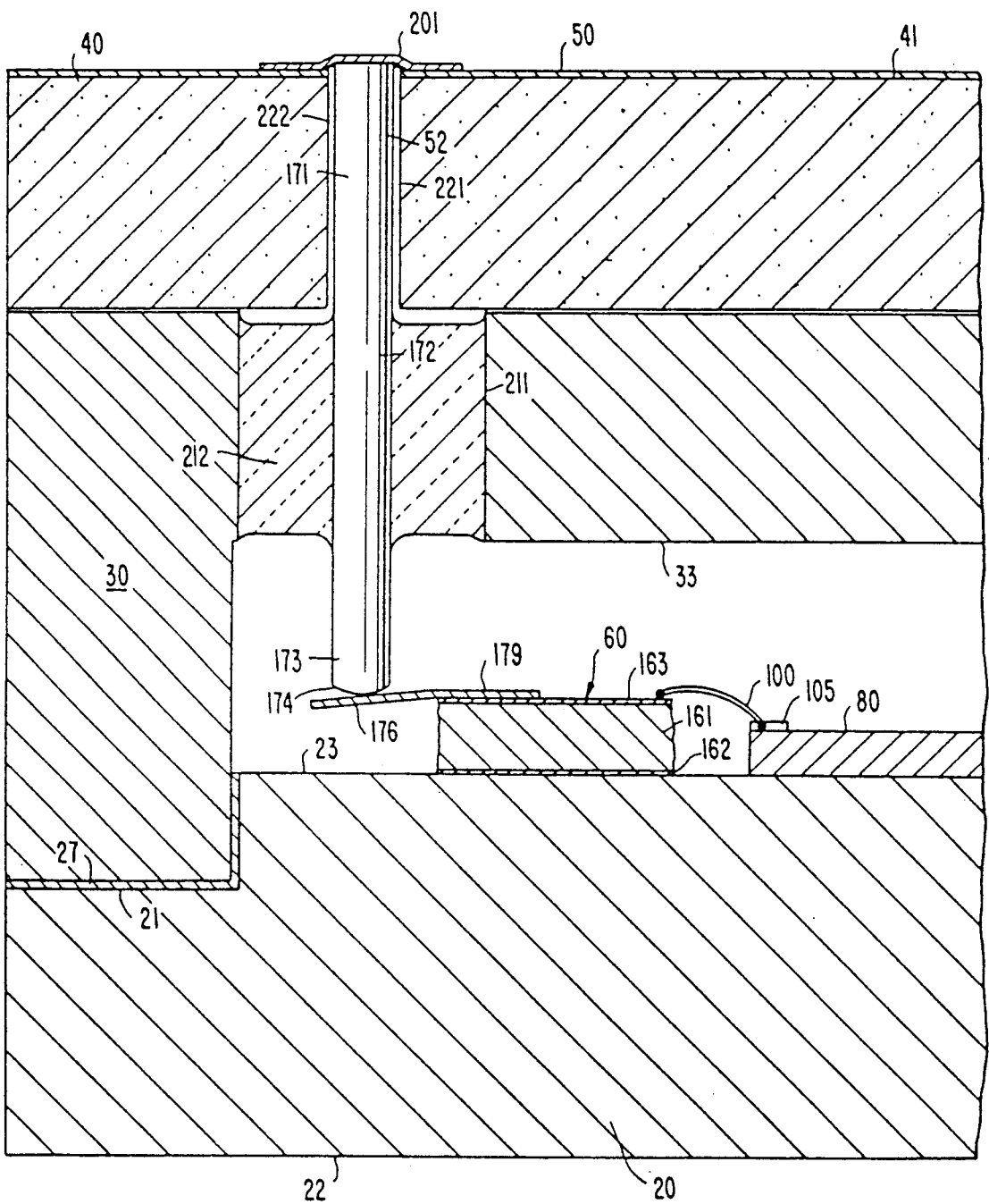
FIG. 5 shows a mechanism for interconnecting an antenna feedthrough pin to a microwave integrated circuit chip mounted on the header at the interior portion of the package.

FIG. 5 shows, in enlarged detail, a mechanism for interconnecting pin 52 to a microwave integrated circuit chip mounted on surface 23 of header 20 at the interior portion of the package. Specifically, pin 52 is shown as having a portion 171, which is surrounded by a thin air gap 222 between the outer diameter of the pin and the diameter of slot 221 through dielectric substrate 40, a portion 172 extending through a glass seal bead 212 which encapsulates the pin 172 and hermetically seals the pin within a cylindrical aperture 211 formed in cover 30, and a portion 173 which projects from the glass seal bead 212 into the package cavity. The end of portion 173 of pin 52 has a gradually curved surface 174 to facilitate its mechanical contact with an internal electrical connection region. In the configuration shown in FIG. 5, this connection region is formed by way of a conductive spring tab 179 mounted to the top surface 163 of a chip capacitor 160. Spring tab 179 is shown as being flexed downwardly at region 176 by the action of the placement of the cover 30 on the header 20 so as to provide frictional engagement between the bottom surface 174 of the pin 52 and the flexed portion 176 of the spring tab 179. Spring tab 179 is affixed (e.g. soldered) to a metallic layer 163 formed atop a dielectric capacitor layer 161 which is joined at its bottom surface 162 to surface 23 of the header 20. In effect, dielectric capacitor layer 161 and metallic layer 163 form chip capacitor 160 with a header 20. A bonding lead between an integrated circuit chip 80 and capacitor 160 is shown as a wire bond 100, which is bonded to the metallic layer 163 on the top surface of the dielectric layer 161 of the capacitor and a bonding pad 105 on the chip 80.

Since the interior extending portion 173 of pin 52 is effectively inductive (L), as is the spring tab 179, capacitor 160 is used to form the middle capacitor portion of an L.C.L low pass filter matching network between 52 and the integrated circuit chip 80, thereby tuning out the unwanted inductance of the pin 52 in providing a desired 50Ω I/O impedance between the antenna element 50 and the chip 80. Connection of the antenna element 50 to the pin 52 may be effected by way of a pin-to-foil solder or welded connection, shown as conductive layer 201 in FIG. 5. Preferably, the metallic cover 30 is braze-bonded to the metallic header 20 at region 27, as shown.

Figure 6:
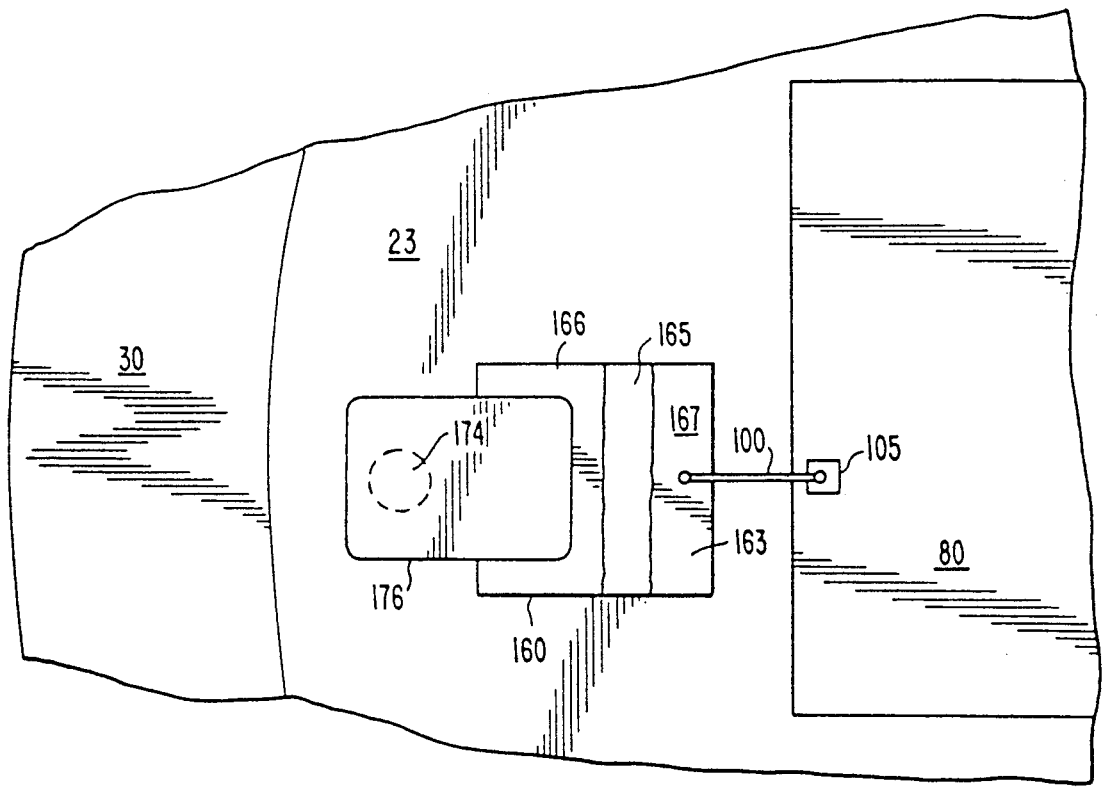
FIGS. 6 and 7 diagrammatically illustrate respective enlarged plan and side views of the region of a spring tab/capacitor connection to an antenna element feedthrough pin.
Figure 7:
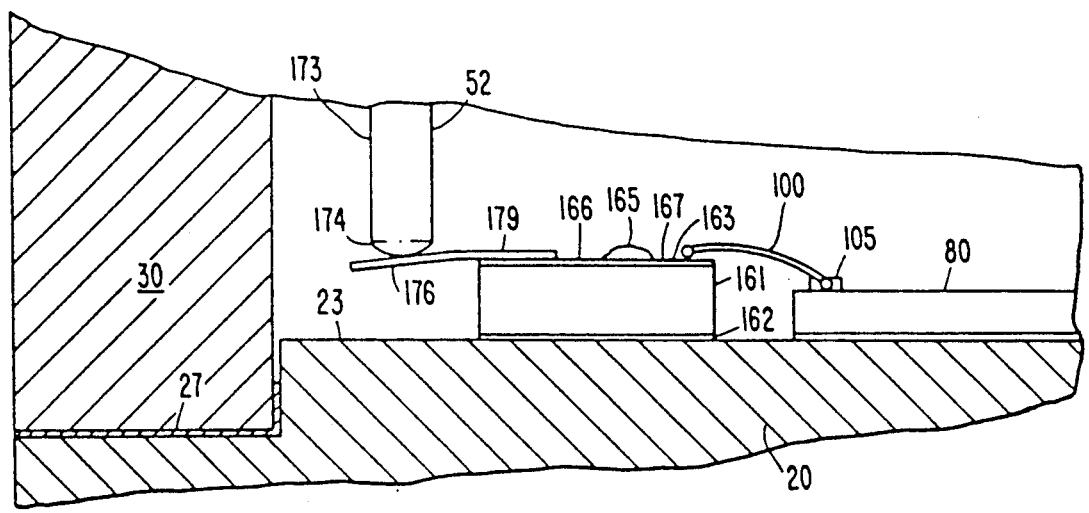

FIGS. 6 and 7 diagrammatically illustrate respective enlarged plan and side views of the region of the spring tab/capacitor connection for coupling pin 52 to the integrated circuit chip, described above with reference to FIG. 5. In the embodiment shown in FIGS. 6 and 7 a solder dam 165 is formed on the top surface of the conductive layer 163 to separate the conductive layer 163 into spaced apart regions 166 and 167. Spring tab 179 is affixed to region 166 while wire bond 100 is affixed to region 163, as shown. As can be seen in FIG. 6, flexing portion 176 of spring tab 179 is of substantial width to permit a degree of play in a circumferential direction of the point at which pin 52 comes in contact with a flexing portion 176 of the spring tab 179. In effect, by providing a spring tab which has a width on the order of 2 to 3 times the diameter of the pin 52 it is possible to provide an effective blind mating of the antenna element on the cover to the microwave circuit component on the header when joining the antenna element coupling pin 52 to the tuning network through which the impedance match between the pin and the MMIC chip 80 is provided.

Figure 8:
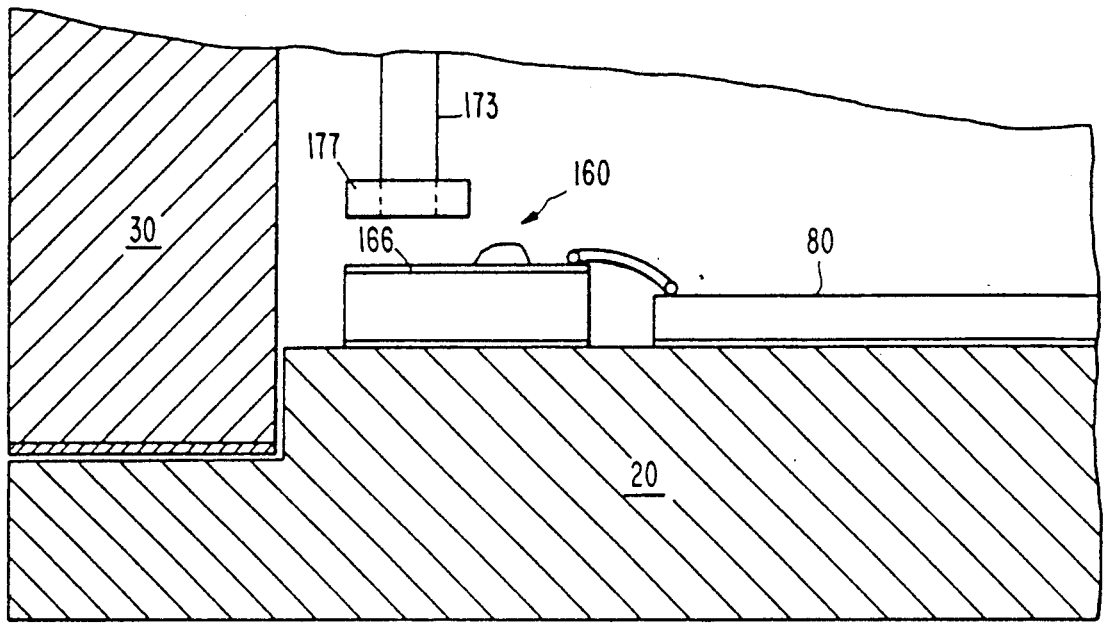
FIGS. 8 and 9 show diagrammatic side views of a further embodiment of a blind fitting between an antenna feedthrough pin and a capacitor portion of the tuning network between the pin from the antenna and an integrated circuit chip.
Figure 9:
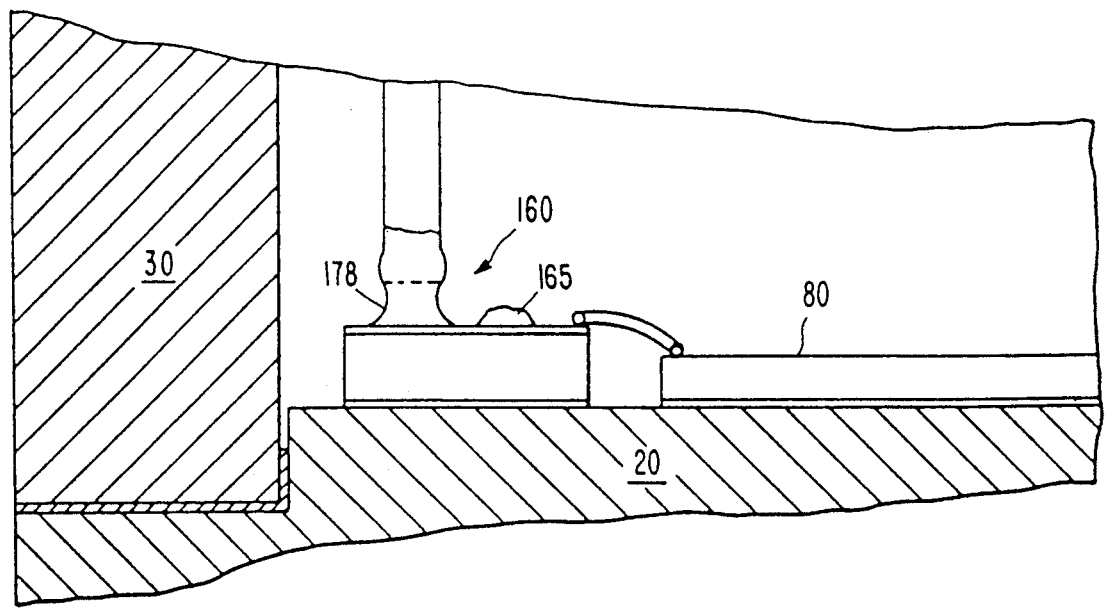

FIGS. 8 and 9 show diagrammatic side views of a further embodiment of providing a blind fitting between the pin 52 and the capacitor portion of the tuning network between the antenna and the integrated circuit chip 80. In this embodiment a solder a disk 177 is formed on the end of the pin 52. When the package temperature is raised, during cover sealing in a braze furnace, the low melting point solder disk 177 flows from the pin to make solid connection to the surface 166 of the chip capacitor 160 The solder dam 165 provides a barrier between the solder reflow region 178 and the wire bond 100.

Figure 10:
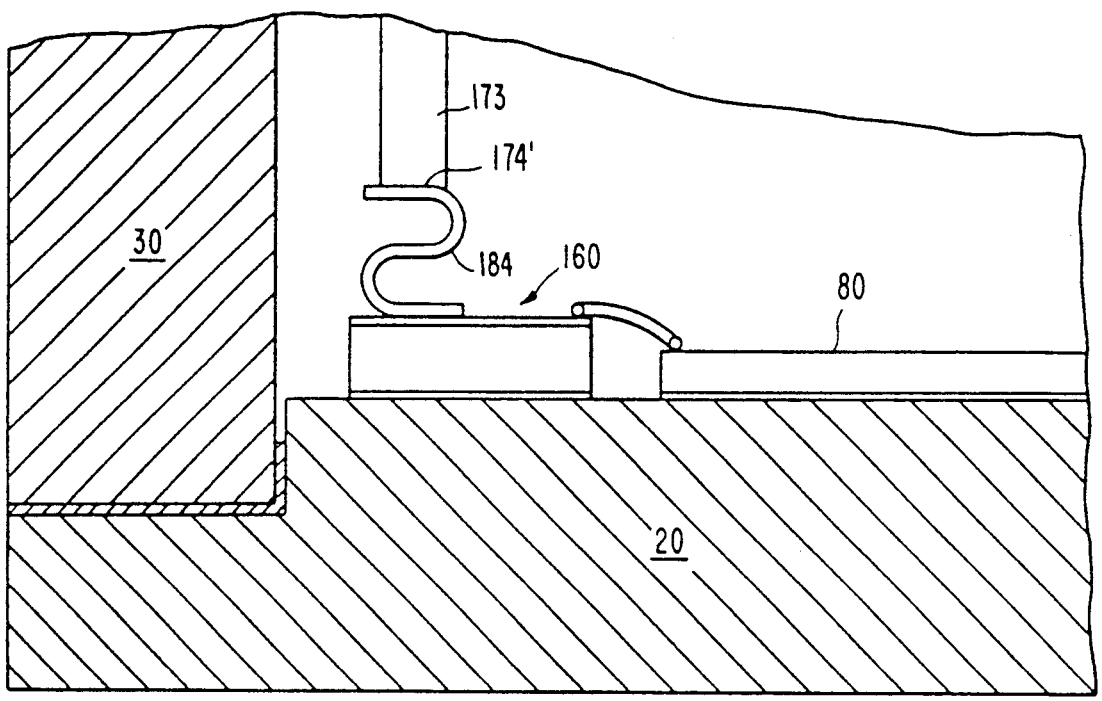
FIGS. 10 and 11 show respective 'pressure-type' mechanisms for providing electrical contact between an antenna feedthrough pin and a chip capacitor.
Figure 11:
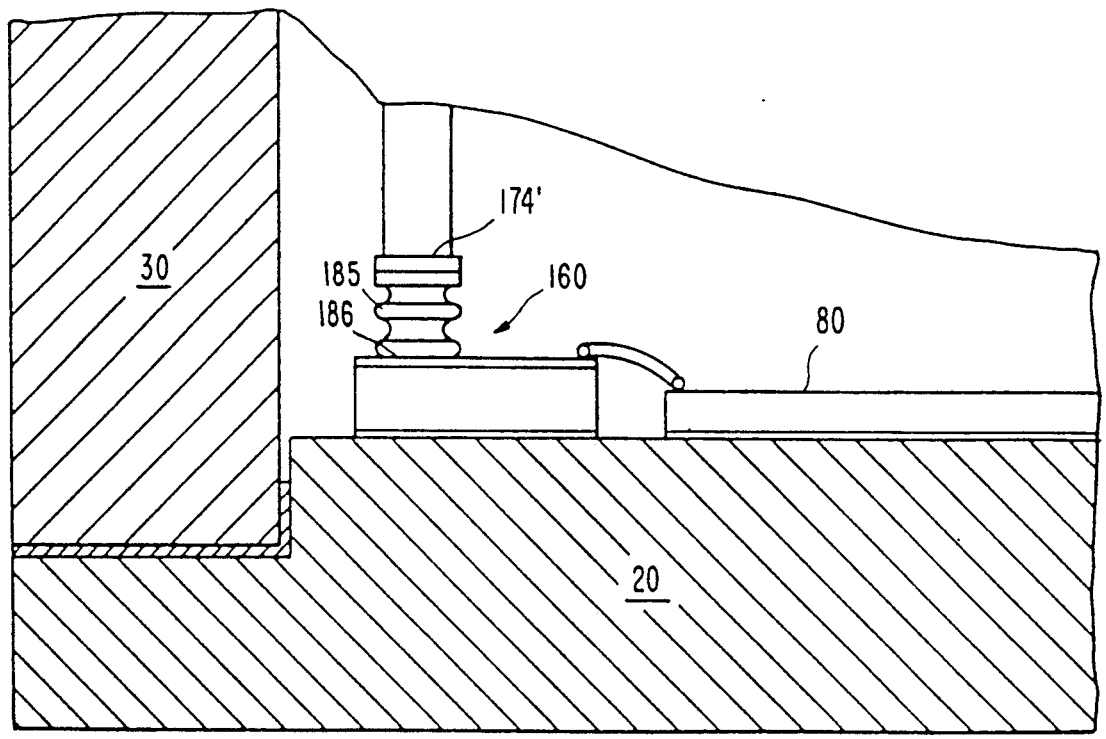

FIGS. 10 and 11 show respective 'pressure-type' mechanisms for providing electrical contact between pin 52 and the chip capacitor 160. In FIG. 10, an "S" spring 184, of the type employed in glass-diode packages, is coupled between a flattened bottom surface 174' of portion 173 of pin 52 (e.g. welded to surface 174') and conductive layer 163 atop chip capacitor dielectric layer 161. In the embodiment shown in FIG. 11, a bellows-spring contact 185 is plated on the end of pin portion 173 and forms a pressure contact with conductive layer 163 of chip capacitor 160 at region 186.

In each of the embodiments of the invention described above the ground return from the cover to the header employs a braze seal contact region 27 (see FIG. 5) between the flange 32 along the sidewall of the cover 30 and the annular periphery 21 of the header 20.

Figure 12:
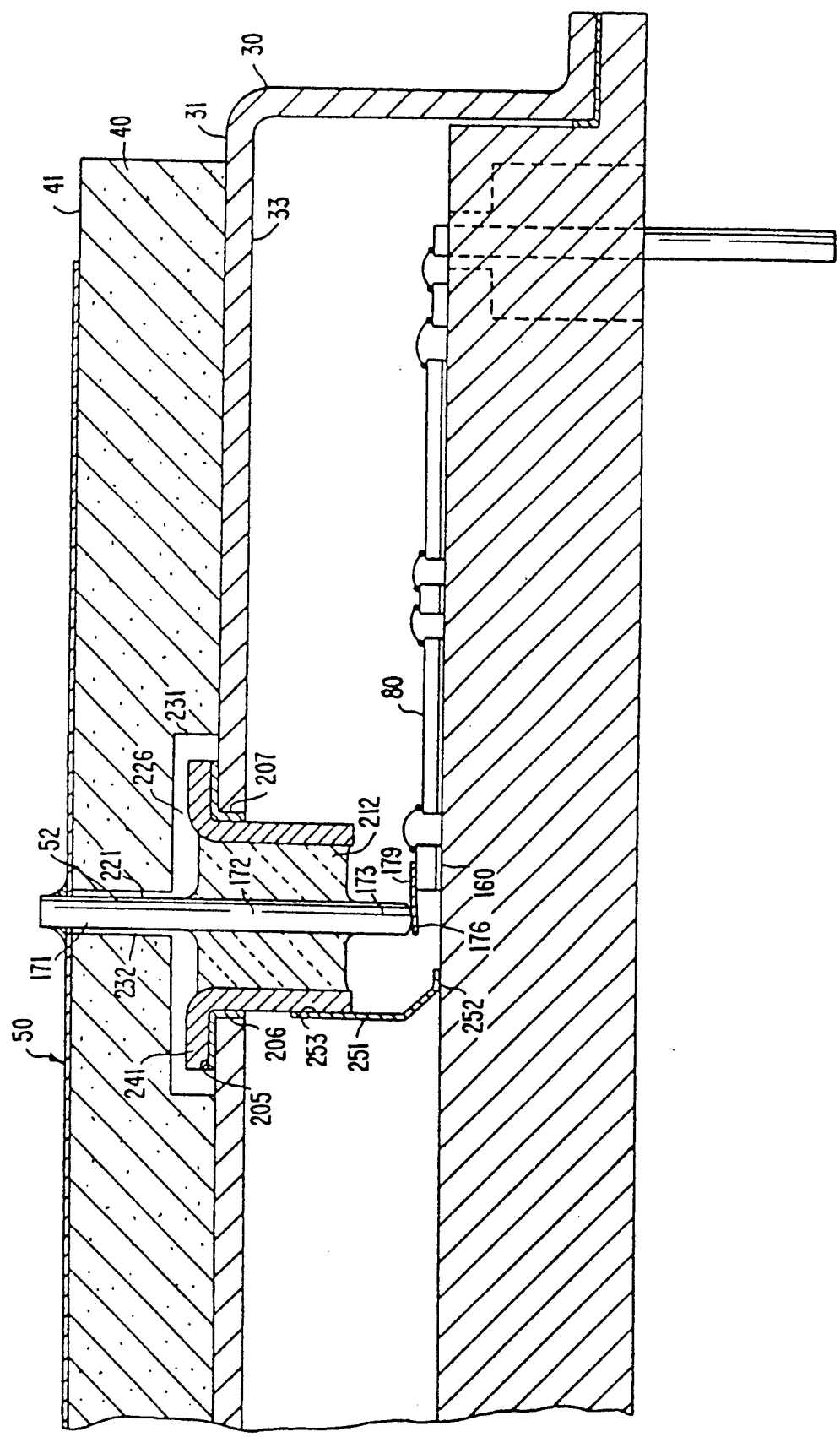
FIG. 12 illustrates an embodiment of the invention in which an antenna-to-chip feedthrough pin is spaced apart from the sidewall of the package cover.

Rather than employ the substantial path length through the metallic cover as the ground return, which path length may add unwanted inductance in the signal ground return, the invention may be modified in the manner shown in FIG. 12 wherein the ground return is located in the region of the antenna-to-chip feedthrough.

More specifically, FIG. 12 illustrates an embodiment in which antenna-to-chip feed through pin 52 is located radially interiorly of the cylindrical sidewall of the cover 30, as opposed to being situated immediately adjacent the sidewall of the cover, as illustrated in FIGS. 4 and 5, described above. In this embodiment, a low inductance ground return is provided by way of spring grounding strap 251 extending from a conductive sleeve or ferrule 241, a cross-section of which has a substantially L-shape soldered at regions 205, 206 of an aperture 207 in cover 30. As described above with reference to FIGS. 3 and 4, control of the impedance through the dielectric layer 40 atop cover 30 is accomplished by controlling the diameter of contiguous cylindrical aperture 231 (of cavity 226) and 232 which extend between the top surface 31 of the cover 30 and the conductive patch antenna element 50 on the top surface 41 of the dielectric substrate 40. The spring grounding strap 251 is connected to the cylindrical wall of the ferrule 241 at region 253 and contacts the metal header 20 at region 252, as shown.

This embodiment of the invention offers a particularly attractive antenna coupling mechanism because the thickness of the cover can be substantially reduced, permitting the cover to be formed as a stamped-out cup, having a thickness on the order of 0.010 inches. The feedthrough connection for the pin 52 employing the L-shaped ferrule 241 and glass seal bead 212 may be soldered to the cover with the spring grounding strap bonded or soldered to the sidewall of the ferrule and forming a pressure contact at region 252 with the metal header 20, thereby achieving requisite ground return and associated 50Ω impedance transition from the antenna element to the MMIC chip-80.

Figure 13:
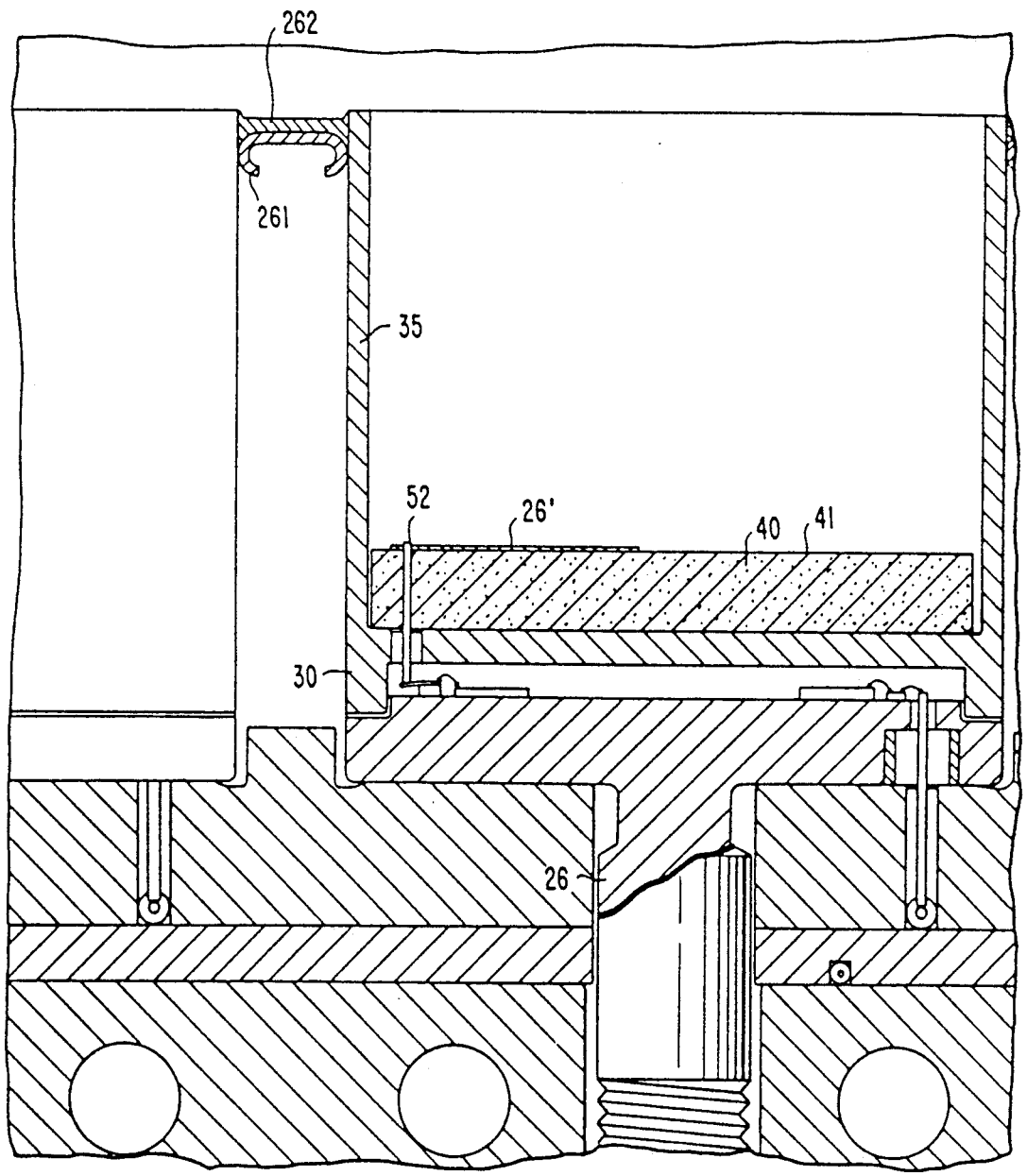
FIGS. 13 and 14 are respective diagrammatic side and top views of the application of the invention to antenna configurations employing waveguide launch configurations.
Figure 14:
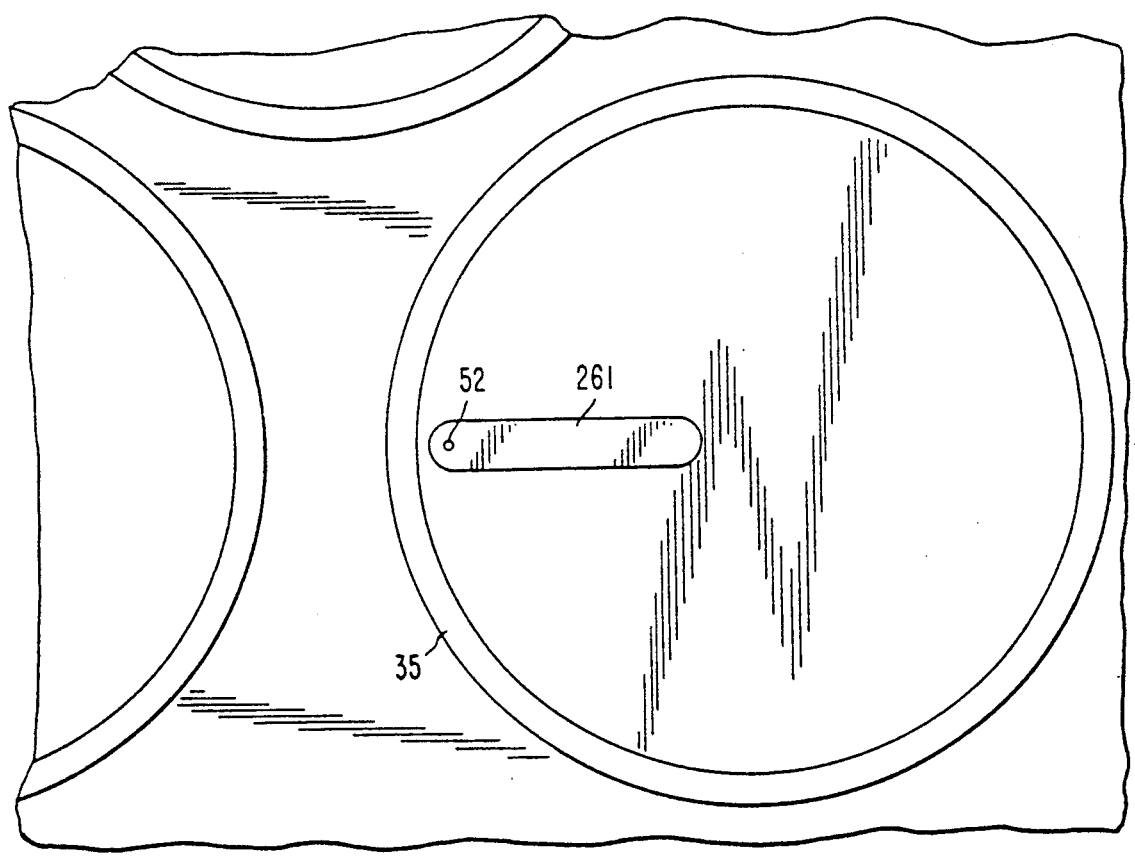

FIGS. 13 and 14 are respective side and top views of the application of the invention to antenna configurations employing waveguide launch configurations, as opposed to a patch antenna element, described above. In accordance with this embodiment, cover 30 is formed with a waveguide extension portion, shown as a cylindrical waveguide 35, which extends above the surface 41 of the dielectric layer on which a conductive launch probe layer 26' for the antenna is formed. The launch probe layer 26' is formed by a narrow elongated conductive strip 26' which extends to feedthrough pin 52, as shown. In a phased array configuration, wherein a plurality of such waveguide elements are nested together, a metallic grounding plate 261 having a plurality of apertures, the diameter of each of which corresponds to the outer diameter of the waveguide sections 35, may be provided to ensure a continuous ground plane for all the waveguide elements. A moisture seal layer 262 is then preferably formed over the grounding plate 261.

To facilitate mounting of the waveguide-type antenna elements of the present embodiment, the header 20 is preferably provided with a threaded shank portion 26, shown in FIG. 13, which permits the header to be readily secured to a transmission line/mounting structure, e.g. a conductive plate having transmission link slots or runways (channels) therethrough, such as a 'channeline' plate structure, described in U.S. Pat. No. 4,641,140, issued Feb. 3, 1987 to D E.Heckaman et al, entitled "Miniaturized Microwave Transmission Link" and assigned to the assignee of the present application, or a 'waffleline' plate structure such as described in our copending U.S. Pat. No. 4,695,810, issued Sep. 22, 1987, by D. Heckaman et al, entitled "Waffleline Configured Microwave Transmission Link" and assigned to the assignee of the present application.

Figure 16:
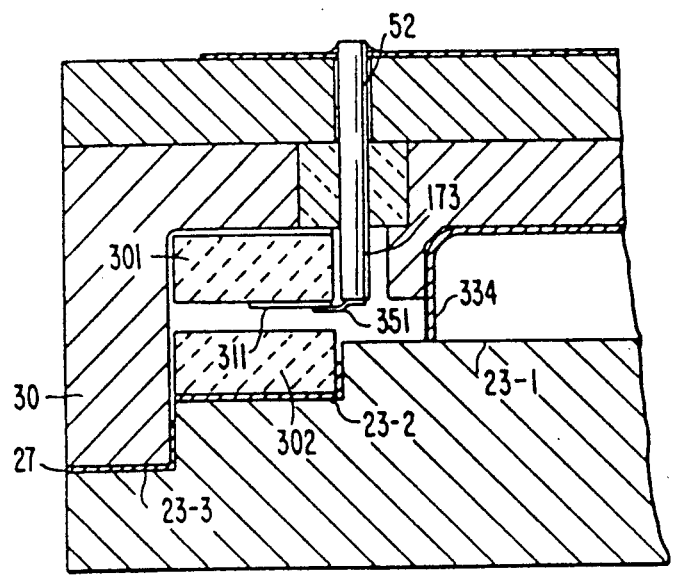
FIGS. 15-17 show respective side, partial side and plan views of an antenna element-containing microcircuit package in accordance with the present invention which employs non-contacting signal connections between the header and the antenna.
Figure 15:
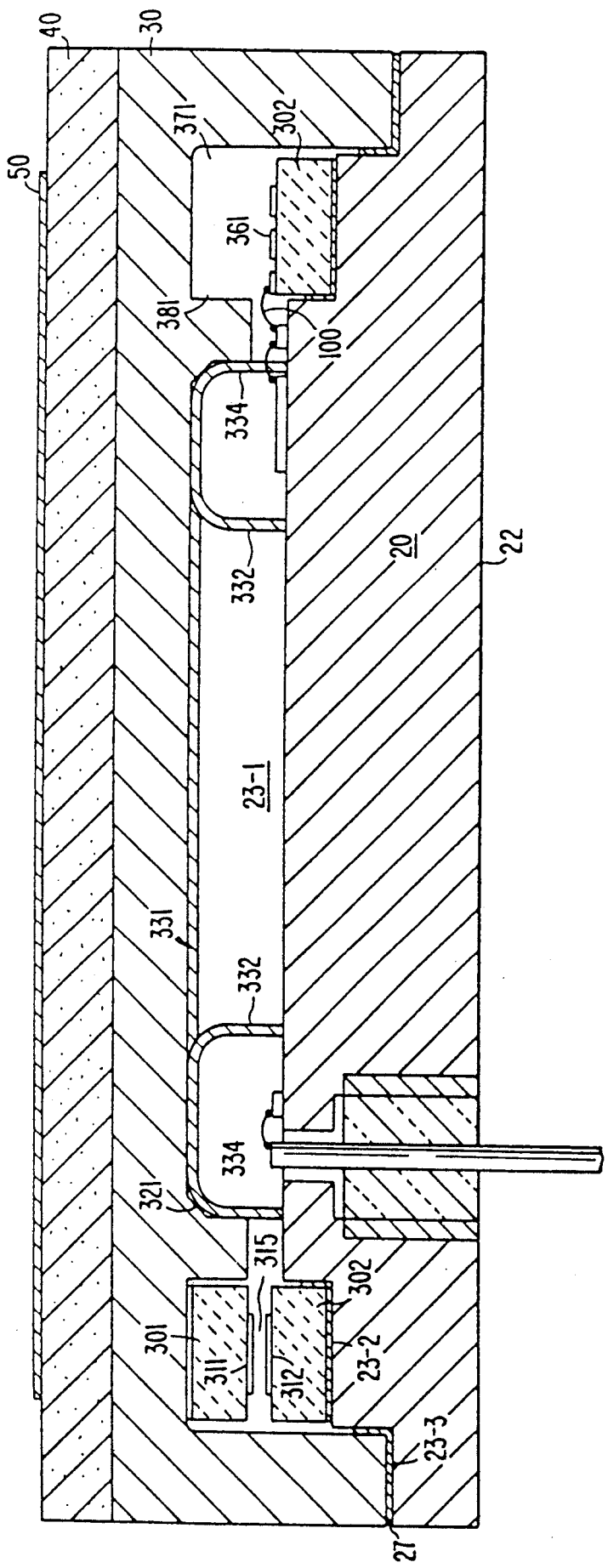
Figure 17:
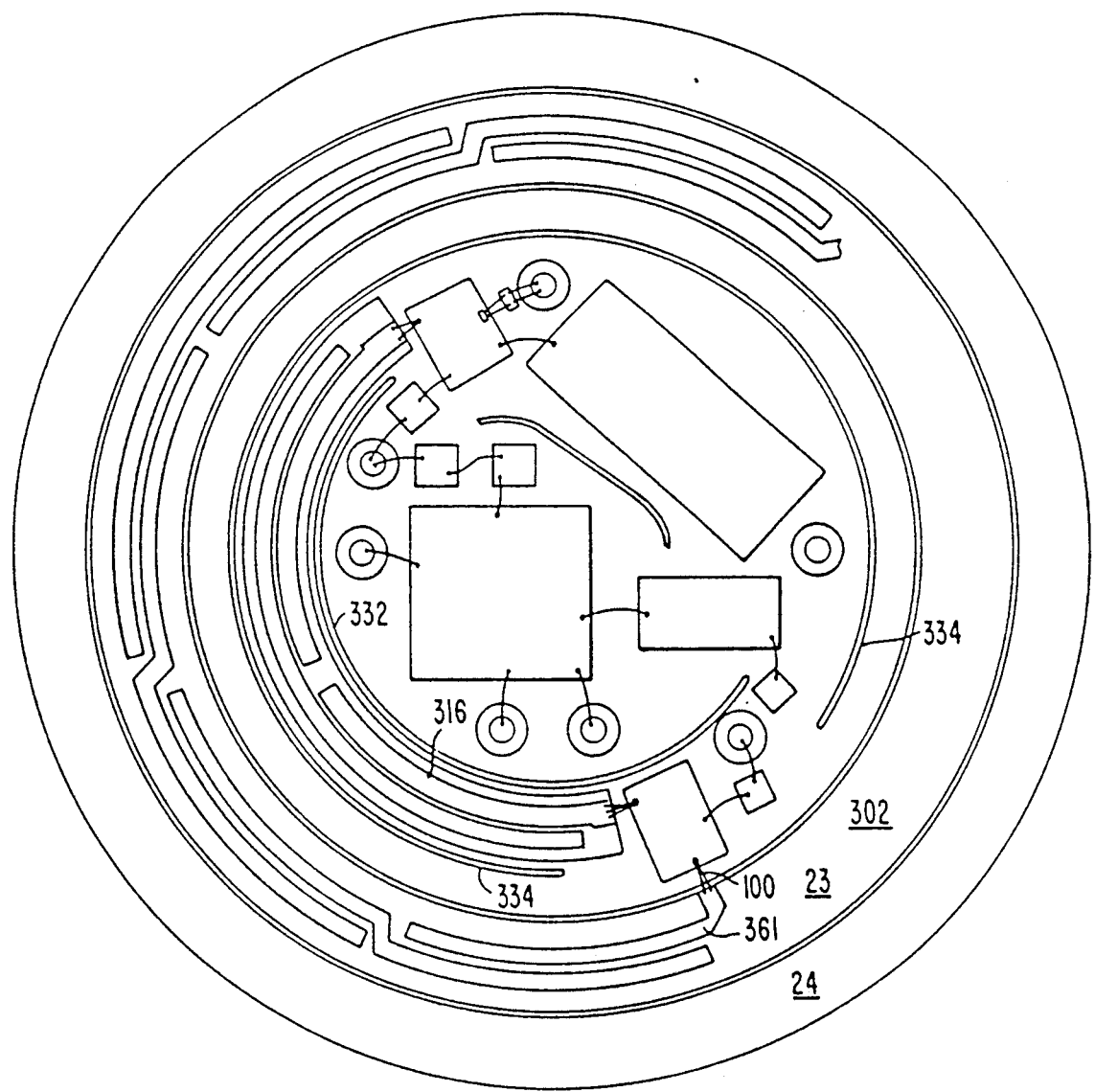

In each of the above-described embodiments of the invention, signal connections between the microwave chip components on the header and the antenna element atop the cover is accomplished by an electrical and mechanical contact element such as a pin-solder connection, contact spring, etc. In accordance with a further embodiment of the invention, air-gap coupled transmission lines, such as those employed with bandpass filter networks, may be used to provide non contacting cover-to-header signal coupling. FIGS. 15–17 show respective side, partial side and plan views of an antenna element-containing microcircuit package in accordance with the present invention which employs such non-contacting signal connections between the header and the antenna.

As shown therein, the header 20 has a tiered top surface, comprised of an upper mesa portion 23-1, and annular stepped or tiered surfaces 23-2 and 23-3 surrounding the mesa surface portion 23-1. The relatively thin MMIC chips are disposed on the top surface 23-1 while a relatively thick annular-shaped ceramic substrate 302 may be disposed on surface step portion 23-2. A bandpass filter 361 comprised of ceramic layer 302 and microstrip conductor layers 312 thereon is situated in an annular cavity 371 defined by the step portion 23-2 and an annular depression cutout region 381 forming the interior surface of the metal cover 30. A separate, relatively thick (on the order of 0.030 inches) ceramic layer 301 resides in the cutout region 381 of the metal cover. The second half of the bandpass filter is formed by microstrip conductive layers 311, which face the microstrip layers 312 on ceramic layer 302, thus completing the bandpass filter. An air gap 315 between conductive layers 311 and 312 provides capacitive coupling between the two halves of the filter.

The connection between the lower half of the filter and the integrated circuit components of the chips may be accomplished through conventional wire bond connections 100 as shown in the right-hand portion of FIG. 15. Connections to the antenna element feedthrough pin 52 are achieved in substantially the same manner, as shown in FIG. 16, with conductive bandpass filter microstrip layer 311 being connected through a bonding tab 351 to portion 173 of pin 52.

Because the components of the filter are formed in respective cutout or tiered surface portions of the header and cover, respectively, they are surrounded by a conductive ground plane, providing complete shielding for the filter elements.

Further shielding of selected portions of the cavity may be provided by a conductive internal wall spring member 331 having wall portions 332, 334, which is captured by a cutout depression 321 within metal cover 30 and the top surface 23-1 of header 20 upon which the cover 30 is mounted.

Figure 18:
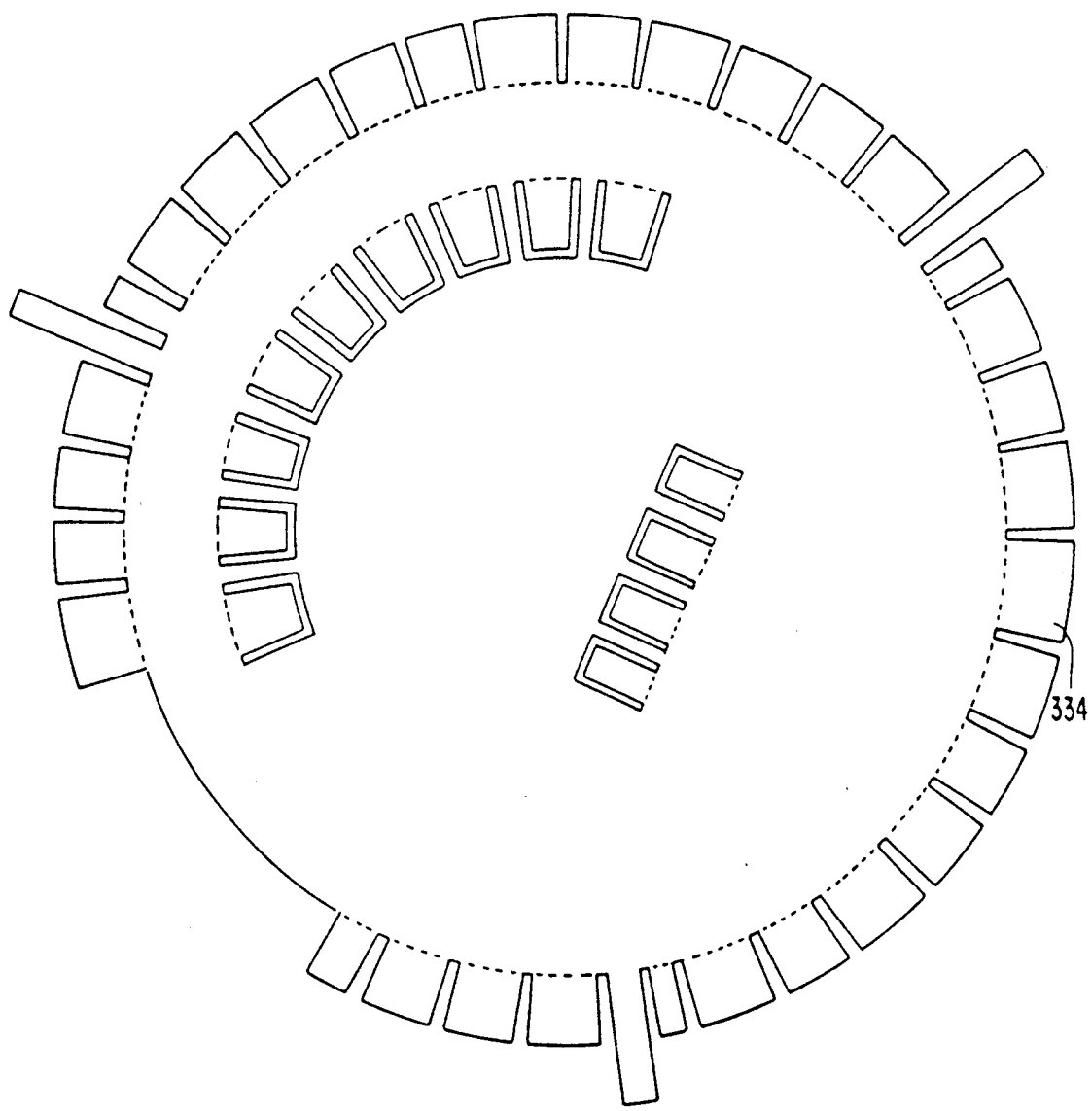
FIGS. 18 and 19 illustrate the manner in which a formed wall spring may be cut out of a sheet of conductive stock and folded to fit with in the confines of the cavity formed by a cutout region in the package cover and top surface of the package header.
Figure 19:
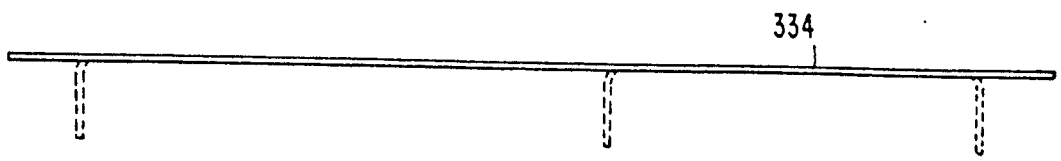

FIGS. 18 and 19 illustrate the manner in which the formed spring may be cut from a sheet of beryllium-copper stock, gold plated and then folded to fit within the confines of the cavity formed by the cutout region 321 in cover 30 and the top surface 23 of header 20.

FIG. 17, referenced previously shows, in plan, the sidewalls of the formed wall spring member 331, as they provide shielding or conductive wall compartmentalization for a radio. The use of the wall spring member 331 is especially attractive where additional electrical isolation is required, such as applications which require high gain and high out-of-band isolation.

In each of the foregoing embodiments of the invention, header 20 is employed as the support surface for the microwave integrated circuit chips. As described above, the header is preferably made of a relatively thick, thermally and electrically conductive material (such as molybdenum) to provide a ground plane and a heat sink for the circuit components disposed on the header 20. In those applications where heat generation is not a substantial factor in the operation of the components, the circuit components may be separated from the heat sink forming header.

In accordance with a further embodiment of the invention, the cover of the package, rather than the header, may be employed to support such circuit components (e.g. microprocessor and memory chips, in particular).

Figure 20:
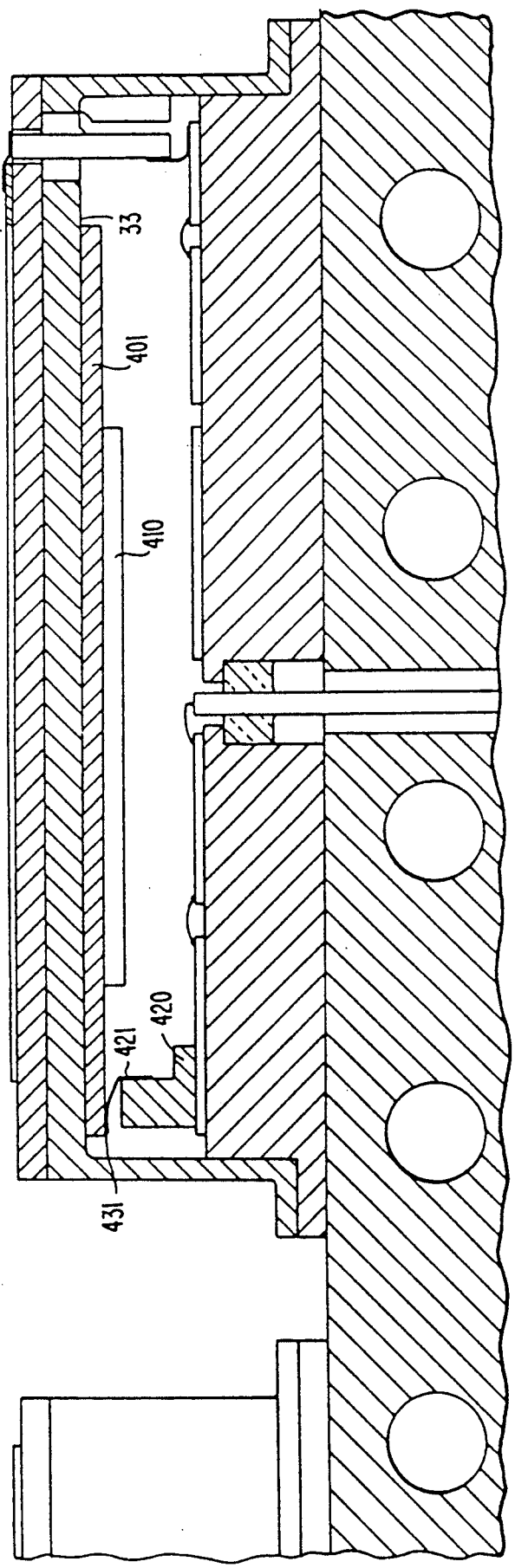
FIGS. 20-22 illustrate respective side and plan views of the cover and header of a further embodiment of the present invention.
Figure 21:
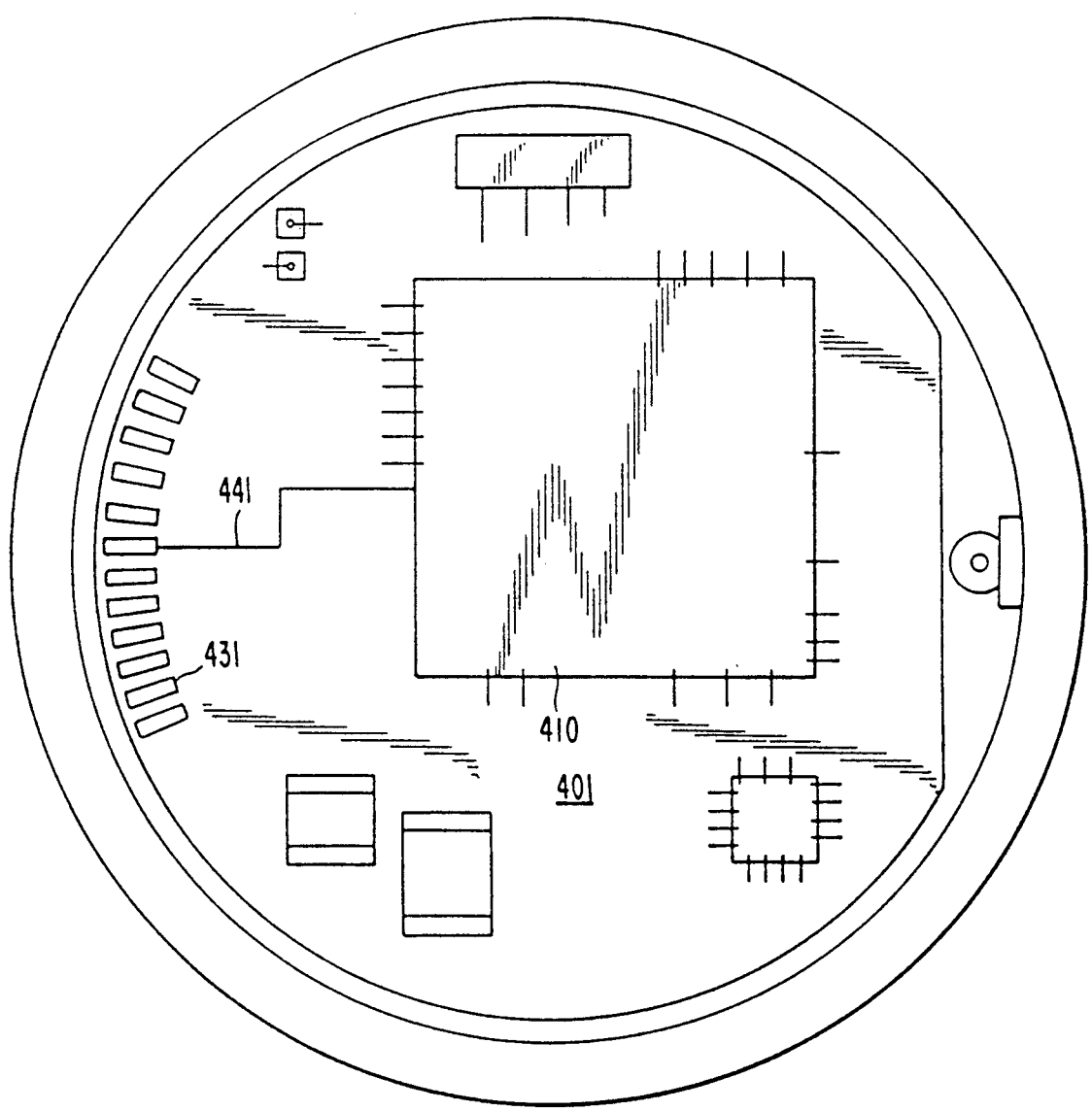
Figure 22:
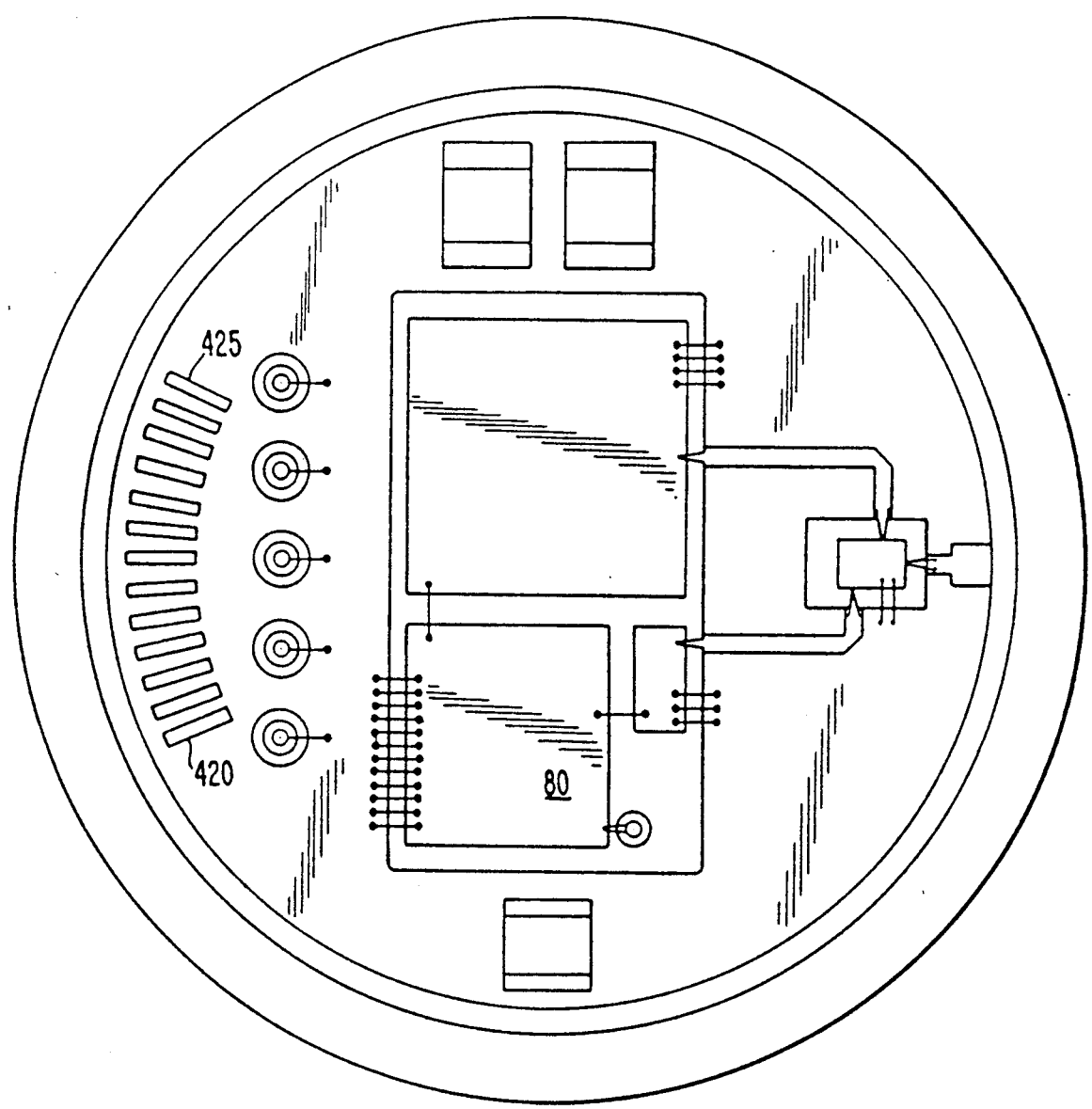

FIGS. 20-22 illustrate side and respective plan views of the cover and header of such an embodiment. As shown therein, an additional support substrate 401 is bonded to the internal surface 33 of the cover 30 and integrated circuit chips 410, such as computer and memory components, are supported on the substrate 401. Plated signal conductors 441 extend from the microprocessor chip 410 to respective contacts of an annular array 431 of conductive regions A conductive spring tab connection 421 may be coupled to electroplated conductive regions 425 on annular L-shaped block 420 which is mounted on header 20 and which faces regions 431. Microstrip signal lines connect block 420 to the microchip components which reside on the header 20 and to external pins 60, described above.

As pointed out previously, the improved TO-style plug-in can of the present invention permits a number of such elements to be nested together on a common support structure for system applications in a reduced size environment. This capability of the present invention makes it an especially attractive mechanism for implementing signalling requirements of mobile communication systems, such as $C^3$ systems.

One particular application of the invention is its use to form a 'smart-skin' on the surface of an advanced technology aircraft. FIG. 23 illustrates the manner in which a cover mounted antenna TO-style package in accordance with the present invention may be configured to effectively form such a 'smart-skin' or phased array radar network on a portion of the fuselage of an aircraft. The fuselage framework is shown at 501, and is covered with an electromagnetic radiation absorber material 503. At prescribed structure regions between adjacent support ribs of formers 502, a section of microwave transmission plate/interconnect structure, such as the above-referenced channeline or waffleline 511 may be mounted to the airframe A plurality of the cover mounted antenna micro chip carrier packages 10 of the present invention may be compactly nested on the transmission line support plate 511 through the use of the threaded header shank portions 26, shown in FIG. 13 discussed above, to provide a mechanism for generating a phased array radar system. Mounted to the absorber structure 503 and situated above the antenna elements of the respective packages 10 is a frequency selective surface 541 such as Teflon-glass. Signal connections to the respective circuitry components of the 'smart-skin' is accomplished by way of plate mounted modules 521, corresponding to the channeline/waffleline connection elements described previously.

As will be appreciated from the foregoing description, the the present invention provides an enhancement of the 'tuned' TO-style plug-in can described in the above referenced copending application, through which standardized packaging of both MMICs and their associated antenna elements in the same modular configuration is achieved. Pursuant to the invention the improved TO-style plug-in package a microstrip antenna element is supported on the outer surface of package cover and is connected to a pin that extends through a glass-sealed aperture, so as to effectively provide a blind mated, matched impedance feed-through signal path, thereby facilitating attachment of the conductive cover to a header upon which a MMIC is supported within the can.

Because of its compact size and total system integration capacity the improved TO-style, plug-in can packaging scheme of the present invention makes it particularly attractive for use in advanced technology applications, such as in the surface structure of a high performance airframe, so as to form a 'smart-skin' for the aircraft with both signal processing and radiation components being housed in what is effectively a thin micro structure that may be integrated within and/or conformally mounted to a confined surface area support framework.

While we have shown and described several embodiments in accordance with the present invention, it is to be understood that the same is not limited thereto but is susceptible to numerous changes and modifications as known to a person skilled in the art, and we therefore do not wish to be limited to the details shown and described therein but intend to cover all such changes and modifications as are obvious to one of ordinary skill in the art.

What is claimed:

1. A support package for a microwave integrated circuit component and an antenna therefor comprising:
   a microwave integrated circuit component carrier having a conductive support upon a generally planar surface of which said microwave integrated circuit component is mounted, said conductive support having at least one aperture therethrough extending from an interior portion of said package, whereat said microwave integrated circuit component is mounted, to an exterior portion of said package;
   a conductor element supported within and extending through a respective aperture in said support, so as to form a transmission line therethrough between said interior portion of said package, whereat said microwave integrated circuit component is mounted, and said exterior portion thereof;
   a cover engageable with said support and enclosing therewith a cavity within which said microwave integrated circuit component is mounted on said support;
   an antenna element supported on an outer surface of a top portion of said cover, said outer surface of said top portion of said cover being parallel to the generally planar surface of said conductive support upon which said microwave circuit component is mounted, said antenna element comprising a conductive layer extending parallel to said generally planar surface, so that the launch direction of an electromagnetic wave emitted by said antenna element is orthogonal to said generally planar surface;

first means, extending through said top portion of said cover, for providing a signal path from said microwave integrated circuit component mounted within said cavity to said antenna element; and second means for providing a conductive path between said conductor element and said microwave integrated circuit component mounted on said conductive support.

2. A support package according to claim 1, wherein said first means comprises means for providing a matched impedance transmission line through said cover between said microwave integrated circuit component and said antenna element.

3. A support package according to claim 1, further including third means, coupled with said second means and said conductor element, for providing a matched impedance transmission line therethrough between said microwave integrated circuit component mounted on said support and the exterior of said package.

4. A support package according to claim 3, further including means for providing an electrical bonding connection between a bonding pad on said microwave integrated circuit component mounted on said support and said conductor element extending through said respective aperture.

5. A support package according to claim 1, wherein said cover is hermetically sealed to said support.

6. A support package according to claim 1, wherein said antenna element includes a section of wave guide supported on said cover, the conductive layer of said antenna element being surrounded by said section of wave guide and serving as a launch probe of the electromagnetic wave emitted by said antenna element.

7. A support package according to claim 1, wherein said conductive support includes a threaded shaft portion through which said package is mounted to a separate structure.

8. A support package according to claim 1, wherein said conductor element comprises a conductor pin supported within and extending through said respective aperture in said support, said conductor pin being conductively engageable with said microwave integrated circuit component at a first portion thereof at said interior portion of said package and forming an inductive reactance component between said circuit component and the exterior of said support and wherein said second means comprises a respective dielectric insulator surrounding said pin and being mechanically coupled to said support so as to support said pin in said respective aperture.

9. A support package according to claim 8, wherein a prescribed region of said respective aperture through which said pin extends has a dielectric constant different from that of said insulator so as to form a prescribed capacitive reactance between said pin and said support, and forms with the inductive reactance component of said pin a prescribed inductive-capacitive impedance matching network between said microwave integrated circuit component and the exterior of said package.

10. A support package according to claim 9, wherein said cover comprises a conductive cover upon an outer surface of which a layer of insulator material is formed, the conductive layer of said antenna element being formed on said layer of insulator material.

11. A support package according to claim 10, wherein said first means comprises a further conductor pin supported within and extending through a respective aperture in said conductive cover, said further conductor pin being conductively engageable with said antenna element at a first portion thereof and forming an inductive reactance component between said antenna element and an interior portion of said package and wherein said first means further comprises a respective dielectric insulator surrounding said further conductor pin and being mechanically coupled to said cover so as to support said further conductor pin in said respective aperture in said cover.

12. A support package according to claim 11, wherein a prescribed region of said respective aperture in said conductive cover through which said further conductor pin extends has a dielectric constant different from that of said dielectric insulator so as to form a prescribed capacitive reactance between said further conductor pin and said conductive cover and forms with the inductive reactance component of said further conductor pin a prescribed inductive capacitive impedance matching network between said antenna element and the interior of said package.

13. A support package according to claim 11 wherein said first means further includes a transmission line capacitive reactance network coupled between a second portion of said further conductor pin and a bonding pad on said circuit component.

14. A support package according to claim 13, wherein said transmission line capacitive reactance network comprises a semiconductor chip capacitor having a first conductive link coupled to said second portion of said further conductor pin and a second conductive link coupled to said bonding pad on said circuit component.

15. A support package according to claim 13, wherein said support comprises a conductive support and said transmission line capacitive reactance network comprises a layer of dielectric material overlying said conductive support and includes a first conductive link coupled to said second portion of said further conductor pin and a second conductive link coupled to said bonding pad on said circuit component.

16. A support package according to claim 15, wherein said first conductive link comprises a spring tab against which said further conductor pin is urged by the engagement of said cover with said support.

17. A support package according to claim 1, wherein said first means comprises means for providing a matched impedance transmission line between said microwave integrated circuit component and said antenna element for a plurality of rotational positions of engagement between said cover and said support about an axis of said conductive support.

18. A support package according to claim 7, wherein said cover comprises a conductive cover upon an outer surface of which a layer of insulator material is formed, the conductive layer of said antenna element being formed on said layer of insulator material.

19. A support package according to claim 18, wherein said first means comprises a conductor pin supported within and extending through said respective aperture in said conductive cover, said conductor pin being conductively engaged with said antenna element at a first portion thereof and forming an inductive reactance component between said antenna element and an interior portion of said package, and wherein said first means further comprises a respective dielectric insulator surrounding said conductor pin and being mechanically coupled to said cover so as to support said conductor pin in said respective aperture in said cover.

20. A support package according to claim 19, wherein a prescribed region of said respective aperture in said conductive cover through which said conductor pin extends has a dielectric constant different from that of said dielectric insulator so as to form a prescribed capacitive reactance between said conductor pin and said conductive cover, and forms, with the inductive reactance component of said conductor pin, a prescribed inductive-capacitive impedance matching network between said antenna element and the interior of said package.

21. A support package according to claim 20, wherein said first means further includes a transmission line capacitive reactance network coupled between a second portion of said conductor pin and a bonding pad on said circuit component.

22. A support package according to claim 21, wherein said antenna element includes a section of wave guide supported on and conductively coupled with said cover, the conductive layer of said antenna element being surrounded by said section of wave guide and serving as a launch probe for the electromagnetic wave emitted by said antenna element.

23. A support package according to claim 22, wherein said layer of conductive material is disposed within the interior of one end of said section of waveguide and provides an electromagnetic wave interface between said section of waveguide and said first means.

24. A support package according to claim 21, wherein said support comprises a conductive support and said transmission line capacitive reactance network comprises a layer of dielectric material overlying said conductive support and includes a first conductive link coupled to said second portion of said conductor pin and a second conductive link coupled to a bonding pad on said circuit component.

25. A support package according to claim 24, wherein said first conductive link comprises a region of reflowed solder between an end of said conductor pin and said conductive layer formed on said layer of dielectric material.

26. A support package according to claim 24, wherein said first conductive link comprises a conductive spring coupled between an end of said conductor pin and said conductive layer formed on said layer of dielectric material.

27. A support package according to claim 24, wherein said first conductive link comprises a conductive bellows coupled between an end of said conductor pin and said conductive layer formed on said layer of dielectric material.

28. A support package according to claim 18, further including means for electrically coupling said conductive cover to a portion of said conductive support interior to the portion thereof whereat said cover engages said support.

29. A support package according to claim 28, wherein said electrically coupling means comprises a conductive member extending through the aperture in said cover and a conductive spring member engaging said conductive member and said conductive support.

30. A support package according to claim 1, wherein said first means comprises means for providing a hermetically sealed matched impedance transmission line feed through said cover between said microwave integrated circuit component and said antenna element.

31. A support package according to claim 30, wherein said first means comprises means for providing a matched impedance transmission line feed through said cover between said circuit component and said antenna element.

32. A support package according to claim 31, wherein said cover comprises a conductive cover upon an outer surface of which a layer of insulator material is formed, the conductive layer of said antenna element comprising a microstrip radiation element formed on said layer of insulator material.

33. A support package according to claim 28, wherein said electrically coupling means comprises a plurality of conductive walls extending between and interior surface of said conductive cover and a surface of said conductive support upon which said microwave integrated circuit component is supported.

34. A support package according to claim 33, wherein said electrically coupling means comprises a conductive spring member having a plurality of spring tab portions arranged to form said plurality of conductive walls, said conductive spring member being retained between said cover and said support, so as to provide a plurality of electrically isolated compartments within said cavity.

35. A support package according to claim 1 wherein said conductive support contains multiple surface tiers, said microwave circuit components being supported on a first of said surface tiers and a further circuit component, having a thickness different from the thickness of said microwave circuit component, being supported on a second of said surface tiers, so that circuit components of different thicknesses may be supported by said conductive support for connections therebetween at effectively the same height, thereby minimizing interconnection inductance therebetween.

36. A support package according to claim 35, wherein said first of said tiers is located at a generally central portion of said conductive support and said second of said tiers is generally annularly shaped, surrounding said first tier.

37. A support package according to claim 19, wherein said first means further includes a transmission line capacitive coupling coupled between a second portion of said conductor pin and a bonding pad on said circuit component.

38. A support package according to claim 37, wherein said transmission line capacitive coupling comprises a first dielectric layer disposed on an interior portion of said conductive cover and a second dielectric layer disposed on said support, and further including first and second respective conductive layers formed on said first and second dielectric layers and being spaced apart from one another by a gap therebetween, said first conductive layer being electrically coupled to said conductor pin and said second conductive layer being electrically coupled to said circuit component.

39. A support package according to claim 38, wherein said conductive support contains multiple surface tiers, said microwave circuit component being supported on a first of said surface tiers and said second dielectric layer and second conductive layer formed thereon being supported on a second of said surface tiers, said second dielectric layer having a thickness different from the thickness of said microwave circuit component.

40. A support package according to claim 39, wherein said first of said tiers is located at a generally central portion of said conductive support and said second of said tiers is generally annularly shaped, surrounding said first tier 41. A TO-type plug-in package for a microwave integrated circuit component and an antenna therefor comprising:
- a microwave circuit component carrier having a conductive header upon which said microwave circuit component is supported said header having at least one aperture therethrough extending from an interior portion of said package whereat said microwave circuit component is supported to an exterior portion of said package;
- at least one conductor pin supported within and extending through a respective aperture in said header, so as to form a transmission line therethrough between said interior portion of said package whereat said microwave circuit component is supported and an exterior portion thereof;
- a conductive cover engageable with said conductive header and enclosing therewith a cavity within which a microwave circuit component is supported;
- an antenna element supported on a dielectric layer overlying an outer surface of said conductive cover;
- first means, extending through said cover, for providing a matched impedance feed-through signal path from a microwave circuit component supported by said header within said cavity, to said antenna element; and
- second means for providing a conductive path between said conductor pin and a microwave circuit component supported by said header.

42. A TO-type plug-in package according to claim 41, further including third means, coupled with said second means and said conductor pin, for providing a matched impedance transmission line therethrough between said microwave circuit element supported on said header and the exterior of said package.

43. A TO-type plug-in package according to claim 42, wherein said first means comprises a further conductor pin supported within and extending through a respective aperture in said conductive cover, said further conductor pin being conductively engaged with said antenna element at a first portion thereof and forming an inductive reactance component between said antenna element and an interior portion of said package, and wherein said first means further comprises a respective dielectric insulator surrounding said further conductor pin and being mechanically coupled to said cover so as to support said further conductor pin in said respective aperture in said cover.

44. A TO-type plug-in package according to claim 43, further including means for providing an electrical bonding connection between a bonding pad on said microwave circuit component mounted on said header and a conductor pin extending through said respective aperture.

45. A TO-type plug-in package according to claim 44, further including means for electrically coupling said conductive cover to a portion of said header interior to the portion thereof whereat said cover engages said header.

46. A TO-type plug-in package according to claim 45, wherein said electrically coupling means comprises a plurality of conductive walls extending between and interior surface of said conductive cover and a surface of said conductive header upon which said microwave circuit component is supported.

47. A TO-type plug-in package according to claim 46, wherein said electrically coupling means comprises a conductive spring member having a plurality of spring tab portions arranged to form said plurality of conductive walls, said conductive spring member being retained between said cover and said header, so as to provide a plurality of electrically isolated compartments within said cavity.

48. A TO-type plug-in package according to claim 41, wherein said conductive header contains multiple surface tiers, said microwave circuit component being supported on a first of said surface tiers and a further circuit component, having a thickness different from the thickness of said microwave circuit component, being supported on a second of said surface tiers, so that circuit components of different thicknesses are supported by said conductive header for connections therebetween at effectively the same height, thereby minimizing interconnection inductance therebetween.

49. A TO-type plug-in package according to claim 48, wherein said first of said tiers is located at a generally central portion of said conductive header and said second of said tiers is generally annularly shaped, surrounding said first tier.

50. A TO-type plug-in package according to claim 43, wherein said first means further includes a transmission line capacitive coupling coupled between a second portion of said further conductor pin and a bonding pad on said microwave circuit component.

51. A TO-type plug-in package according to claim 50, wherein said transmission line capacitive coupling comprises a first dielectric layer disposed on an interior portion of said conductive cover and a second dielectric layer disposed on said header, and further including first and second respective conductive layers formed on said first and second dielectric layers and being spaced apart from one another by a gap therebetween, said first conductive layer being electrically coupled to said further conductor pin and said second conductive layer being electrically coupled to said microwave circuit component.

52. A TO-type plug-in package according to claim 51, wherein said conductive header contains multiple surface tiers, said microwave circuit component being supported on a first of said surface tiers and said second dielectric layer and second conductive layer formed thereon being supported on a second of said surface tiers, said second dielectric layer having a thickness different from the thickness of said microwave circuit component.

53. A TO-type plug-in package according to claim 52, wherein said first of said tiers is located at a generally central portion of said conductive header and said second of said tiers is generally annularly shaped, surrounding said first tier.

54. A TO-type plug-in package for microwave integrated circuit components and an antenna therefor comprising:
- a conductive header upon which at least one first microwave circuit component is supported, said conductive header having at least one aperture therethrough extending from an interior portion of said package, whereat said first microwave circuit component is supported, to an exterior portion of said package;

at least one conductor supported within and extending through a respective aperture in said header so as to form a transmission line therethrough between said interior portion of said package, whereat said first microwave circuit component is supported, and an exterior portion thereof;

a conductive cover engaging with said conductive header and enclosing therewith a cavity;

at least one second microwave circuit component supported on an interior surface portion of said cover within said cavity;

an antenna element supported on a dielectric layer overlying an outer surface of said conductive cover;

first means, extending through said cover, for providing a matched impedance feed-through signal path, from a first microwave circuit component supported by said header within said cavity, to said antenna element;

second means for providing a conductive path between said conductor and said first microwave circuit component supported by said header; and third means for providing an electrical connection between said second microwave circuit component supported on the interior surface of said cover and said first microwave circuit component supported by said header.

55. A TO-type plug-in package according to claim 54, wherein said first means comprises means for providing a hermetically sealed matched impedance transmission line feed through said cover between said first microwave circuit component and said antenna element.

56. A TO-type plug-in package according to claim 55, wherein said first means comprises means for providing a matched impedance transmission line feed through said cover between said first microwave circuit component and said antenna element.

57. A multi-component antenna mounted to a vehicle structure comprising:

a transmission line structure integrally supported with said vehicle structure; and a plurality of microwave signal processing/antenna modules supported adjacent to and coupled with said transmission line structure, each of said microwave signal processing/antenna modules including a microwave circuit component carrier having a conductive support upon a generally planar surface of which a microwave integrated circuit component is mounted, said support having at least one aperture therethrough extending from an interior portion of said module whereat said microwave circuit component is mounted to an exterior portion of said module, a conductor element supported within and extending through a respective aperture in said conductive support, so as to form a transmission line therethrough between said interior portion of said module, whereat said microwave circuit component is mounted, and an exterior portion thereof, said conductor element being coupled to a portion of said transmission line structure, a cover engageable with said support and enclosing therewith a cavity within which said microwave circuit component is mounted on said conductive support, an antenna element supported on an outer surface of a top portion of said cover, said outer surface of said top portion of said cover being parallel to the generally planar surface of said conductive support upon which said microwave circuit component is mounted, said antenna element comprising a conductive layer extending parallel to said generally planar surface, so that the launch direction of an electromagnetic wave emitted by said antenna is orthogonal to said generally planar surface, first means, extending through said top portion of said cover, for providing a signal path from said microwave circuit component mounted within said cavity to said antenna element, and second means for providing a conductive path between said conductor element and said microwave circuit component mounted on said conductive support.

58. A multi-component antenna according to claim 57, further comprising a frequency selective surface structure overlying said plurality of signal processing-/antenna modules.

59. A multi-component antenna according to claim 57, wherein said vehicle comprises an aircraft.

60. A multi-component antenna according to claim 57, wherein said transmission line structure includes a thermally and electrically conductive plate structure containing a matrix of transmission line channels and means for applying a cooling medium to said plate structure for controlling the temperature of operation of said signal processing/antenna modules.

* * * * *